United States Patent [19]
Xue et al.

[11] Patent Number: 6,091,892
[45] Date of Patent: Jul. 18, 2000

[54] METHOD FOR MAPPING PRODUCT TERMS IN A COMPLEX PROGRAMMABLE LOGIC DEVICE

[75] Inventors: Hua Xue, Sunnyvale; David A. Harrison, Cupertino; Joshua M. Silver, Sunnyvale, all of Calif.

[73] Assignee: Xilinx, Inc., San Jose, Calif.

[21] Appl. No.: 08/746,603

[22] Filed: Nov. 13, 1996

[51] Int. Cl.$^7$ .................................................. G06F 3/00
[52] U.S. Cl. .................................. 395/500.13; 395/500.37
[58] Field of Search .................................. 364/488, 489, 364/490, 491; 395/500.37

[56] References Cited

U.S. PATENT DOCUMENTS

| | | | |
|---|---|---|---|
| 5,499,191 | 3/1996 | Young | 364/489 |
| 5,521,529 | 5/1996 | Agrawal et al. | 326/41 |
| 5,600,569 | 2/1997 | Nishiyama et al. | 364/489 |
| 5,636,368 | 6/1997 | Harrison et al. | 395/500 |

OTHER PUBLICATIONS

Xilinx Programmable Gate Array Data Book, pp. 3–1 through 3–67, 1996, available from Xilinx, Inc. 2100 Logic Drive, San Jose, CA 95124.

*Primary Examiner*—Paul R. Lintz
*Assistant Examiner*—Thuan Do
*Attorney, Agent, or Firm*—Patrick T. Bever; Jeanette S. Harms

[57] ABSTRACT

A method for programming complex programmable logic devices (CPLDs) to implement a logic function, whereby user-designated locked equations of the logic function are mapped into the macrocells of a function block, and then undesignated (non-locked) equations are mapped into the remaining macrocells. The method shifts product terms between the macrocells to adjust the placement arrangement of the mapped equations, thereby obtaining a placement arrangement which is both valid and meets user-defined timing constraints.

15 Claims, 17 Drawing Sheets

XC9500 ARCHITECTURE

XC9500 FUNCTION BLOCK

XC9500 MACROCELL WITHIN FUNCTION BLOCK

PRODUCT TERM ALLOCATOR LOGIC

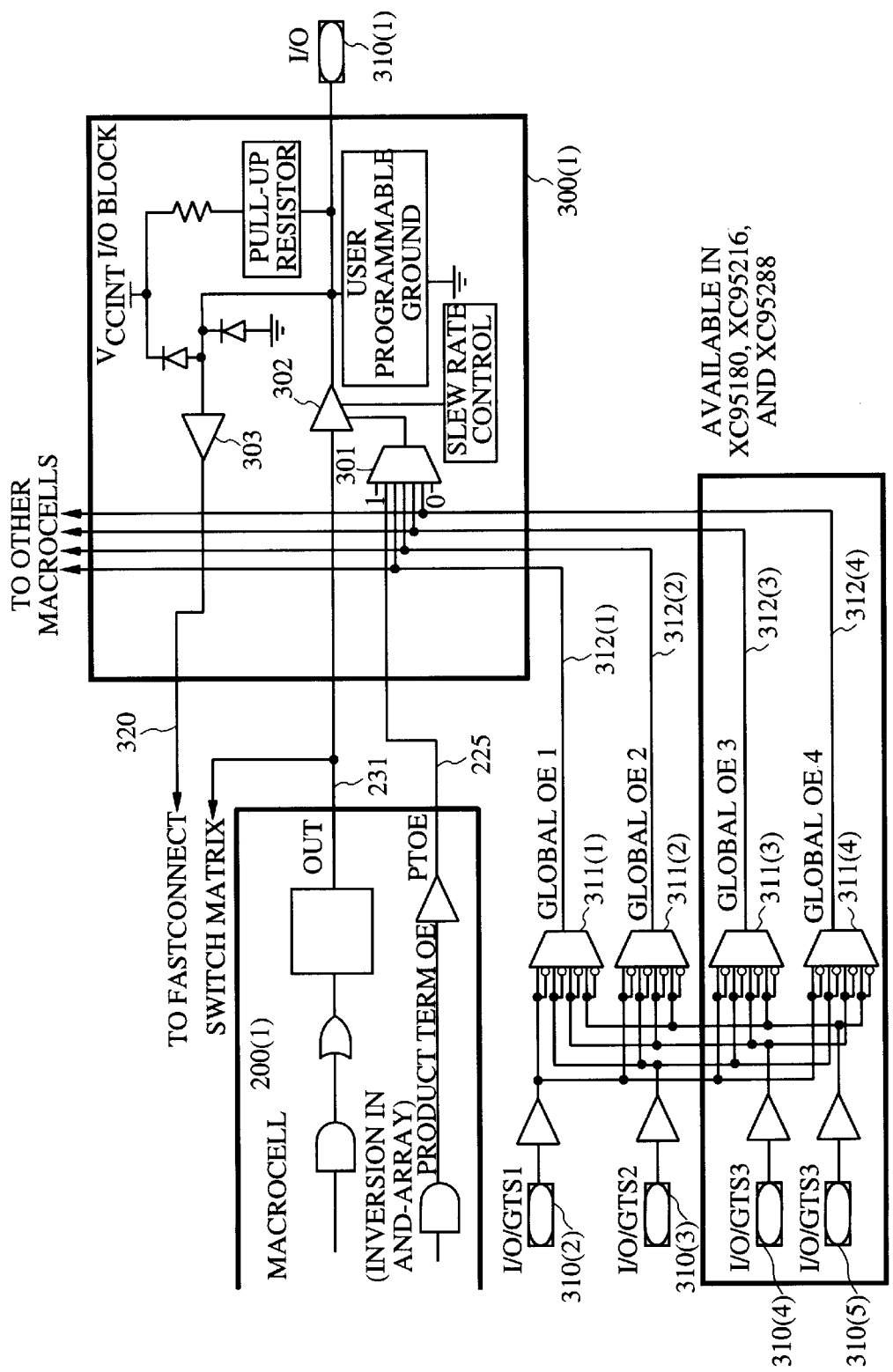
FIGURE 3 I/O BLOCK AND OUTPUT ENABLE CAPABILITY

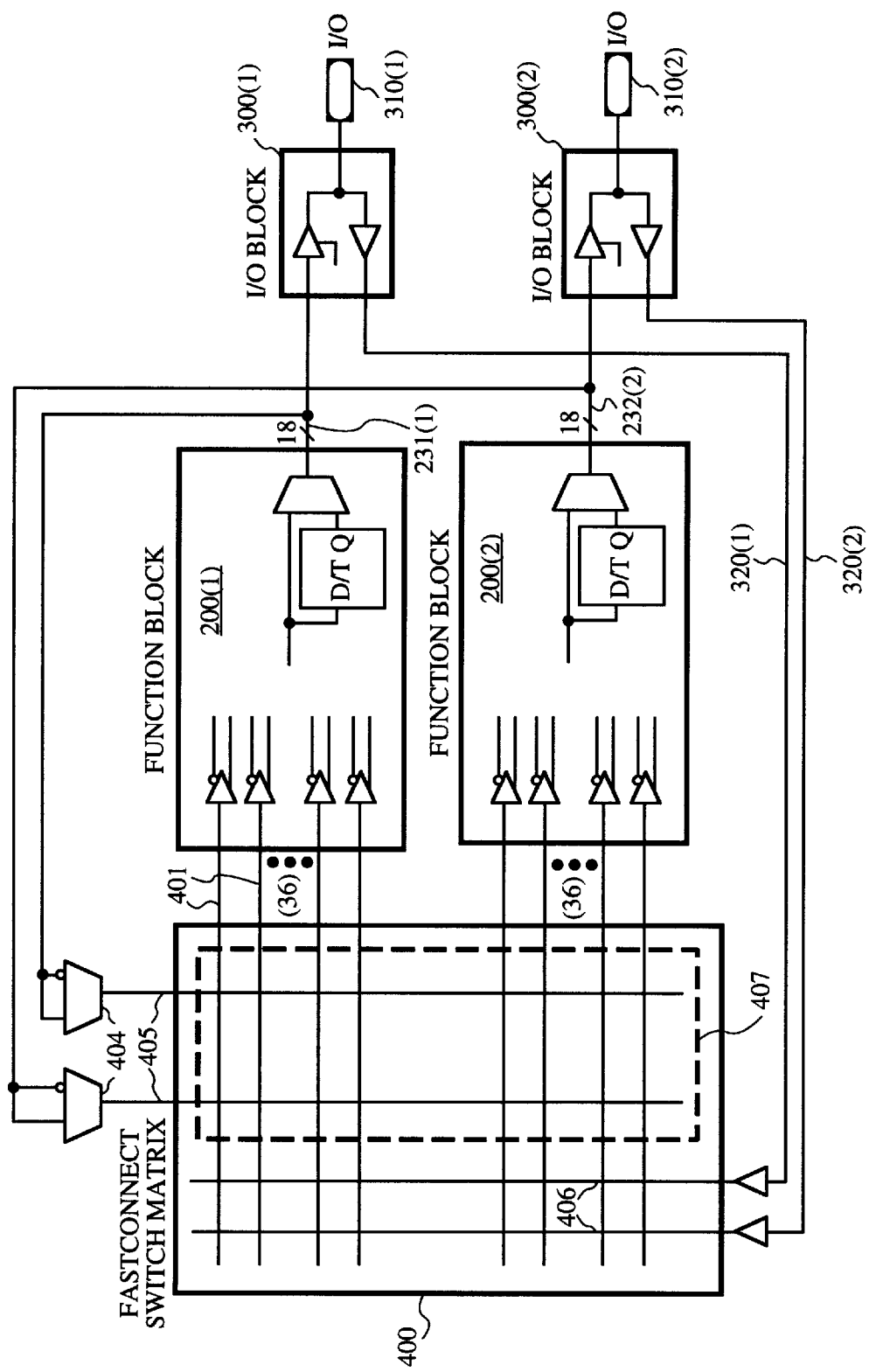
FIGURE 4  FASTCONNECT SWITCH MATRIX

METHOD FOR MAPPING PRODUCT TERMS IN A COMPLEX PROGRAMMABLE LOGIC DEVICE

BACKGROUND OF THE INVENTION

1. Field of the Invention

The present invention relates to programmable logic devices, and more specifically to a method for mapping product terms (P-terms) into complex programmable logic devices in which all of the P-term elements of a function block are routable to each macrocell of the function block.

2. Background Art

Programmable logic devices (PLDs) are a class of integrated circuits (ICs) which can be programmed by a user to emulate various logic functions. Logic designers typically use PLDs to implement control logic in electronic systems because they are relatively easy to program, and often can be reprogrammed to update the emulated logic function. This makes their use in an electronic system's design phase less costly than custom hardwired or "application specific" integrated circuits (ASICs).

One major class of PLDs includes a set of input pins, a programmable AND plane connected to the input pins, an OR plane connected to outputs of the AND plane and a set of output pins connected to outputs of the OR plane. The AND plane provides a matrix of programmable connections where each column connects to an input pin and each row forms an output of the AND plane, called a product term (P-term) element, which is transmitted to the OR plane. The OR plane may be programmable, such that each P-term element is connectable to columns leading to different output pins, in which case the PLD is called a programmable logic array (PLA). Alternatively, the OR plane may be fixed, such that each P-term element is assigned to a particular output pin, in which case the PLD is called a programmable array logic (PAL) device.

PLAs and PALs contain two levels of logic (AND and OR) and are capable of implementing logic functions that are representable in "sum-of-products" form. The sum-of-products form of a logic function includes a set of P-terms which are collectively "ORed" together to produce the function's output signal. Such a logic function is represented in a PLD by programmed connections in the AND plane and OR plane. Each P-term element has a programmable input connection in the AND plane to each input pin and produces a single output value representing the logical AND or "product" of the connected inputs. Usually, both the original input pin value and its complement are available for connection to a P-term element. Each output has a programmable P-term element connection in the OR plane and produces an output value representing the logical OR or "sum" of the connected P-term elements.

These early PLDs were well-received by logic designers. However, as logic functions grew increasingly larger and more complex, logic designers were required to wire together two or more small PLDs to provide sufficient logic capacity. Although this process was tolerated during development and testing, it increased the cost and size of production units. This generated a demand for PLDS with increasingly larger logic capacity.

To meet the ever-increasing demand for greater capacity, PLDs with increasingly complex architectures have been developed. One popular complex PLD type, known as complex programmable logic devices (CPLDs), includes two or more "function blocks" connected together and to input/output (I/O) resources by an interconnect matrix such that each of the function blocks communicates with other function blocks of the CPLD through the interconnect matrix. Each function block of the CPLD is structured like the two-level PLDs, described above. In effect, these CPLDs incorporate several early PLDs and associated connection circuitry onto a single integrated circuit. This provides a circuit designer the convenience of implementing a complex logic function using a single IC.

Each function block of an early CPLD typically includes an AND array and a set of macrocells. The input signals of the AND array are received from the interconnect matrix, and each of the P-term elements generated by the AND array is assigned to one of the macrocells such that a specific number of P-term elements are assigned to each macrocell. Each macrocell includes an OR gate which is programmable to receive one or more of the assigned P-term elements, and also to receive a sum-of-products term from an adjacent macrocell of the function block (see the discussion below regarding the "chaining" process). The OR gate of each macrocell produces a sum-of-products term which is either Transmitted to output circuitry of the CPLD, fed back to the interconnect matrix, or is transmitted to an adjacent macrocell (by the "chaining" process, discussed below). To simplify the following discussion, it is assumed that the macrocells of each function block are arranged side-by-side in a row such that a centrally-located macrocell has at least one macrocell located on its "right", and one macrocell located on its "left".

The macrocells of these early CPLDs are programmable to share their assigned P-term elements with one adjacent macrocell by a process referred to herein as "chaining". As mentioned above, an OR gate of each ("first") macrocell receives a specific number of P-term Elements (e.g., five) from the AND array, and is also programmable to receive a sum-of-products term from an adjacent ("second") macrocell (e.g., the macrocell located to the immediate "left" of the first macrocell). To implement a function requiring more that the specific number of P-term elements (e.g., eight P-term elements), the second macrocell is programmed to transmit three of the P-term elements as a sum-of-products term to the OR gate of the first macrocell, thereby increasing the number of P-term elements utilized by the first macrocell to eight. By this process, the first and second macrocells are "chained" together to implement functions made up of a large number of P-terms. Even larger functions are implemented by "chaining" additional macrocells to the first and second macrocells in the manner described above.

A restriction of these early CPLDs is that the "chaining" process is only available in one "direction". For instance, P-term elements are only transmitted "right" from the second macrocell to the first macrocell; P-term elements cannot be transmitted "left" from the first macrocell to the second macrocell. This reduced the programming "flexibility" of these early CPLDs because, given a multiple P-term function whose output is assigned to the first macrocell, the only available source of additional P-tern elements is to the "left" of the first macrocell. If another function is already implemented by the second macrocell, the programming process fails because the first macrocell cannot be "chained" to receive P-term elements from a macrocell which is located to the "right" of the first macrocell.

SUMMARY OF THE INVENTION

The present invention involves mapping P-terms in complex PLDs having two-way P-term exporting capabilities in order to implement logic functions comprising "locked" equations, whereby a first equation of the logic function is "pushed" (shifted) into one of two adjoining macrocells in order to accommodate a second equation. This allows the complex PLD to be programmed to meet the pin-out requirements of a user.

In the specific example described below, a CPLD includes a function block wherein any or all of the P-term elements from an AND array are programmably routed to each macrocell through a product term allocator circuit. Unlike the early CPLDs in which a macrocells are "chained" in one direction only, this recently-developed CPLD includes resources which allow exporting in both directions (i.e., both "right" and "left"). The above-mentioned prior art programming methods are inadequate for programming this recently-developed CPLD because these prior art methods fail to provide process steps for maximizing the P-term "exporting" capability of these recently-developed CPLDs to implement densely-populated functions.

The programming method in accordance with the present invention begins by converting the logic equations of a user's logic function using known techniques into one or more equations which have the greatest possibility of being mapped into the P-term elements and macrocells of the function blocks.

The programming method then determines which of the equations are designated by the user as being "locked" (i.e., designated implementation such that the output of the equation is transmitted through a specific "target" macrocell so that it is applied to a specific I/O pin of the CPLD). A valid placement range is then determined for each locked equation indicating a range of P-term elements which may be used to implement the equation while meeting the I/O pin requirement. These designated locked equations are then mapped into the P-term elements roughly in the center of the valid placement range.

After all locked equations are mapped, the remaining (undesignated) equations are then mapped, if possible, into the remaining resources of the FBs. If any of the locked or undesignated equations cannot be mapped into a slot located between two previously-mapped locked equations, then the programming method "pushes" (shifts) the previously-mapped equations into adjacent P-term elements (to the extent allowable by the valid placement range associated with the locked equation), thereby attempting to "free" (make available) sufficient P-term elements for the unmapped equation.

After mapping the non-locked equations, the placement arrangement is subjected to a "shuffling" (placement refinement) subroutine during which the equations are rearranged in an attempt to eliminate any placement constraint violations. These placement constraints are defined by the specific circuitry of the target CPLD.

After a placement arrangement is determined which is free of placement constraint violations, the placement arrangement is subjected to a second shuffling process for optimizing the timing performance of the logic function. During this second shuffling process, each non-locked equation having at least one P-term which violates timing constraints assigned to the logic function is shuffled into various slots in an attempt to find a more efficient placement arrangement. If shuffling an equation into a slot creates a placement constraint violation, the shuffling process moves the equation to a subsequent slot. If no placement constraint violations arise, the shuffling process re-assigns the equation to the slot. Once this process yields a placement arrangement having zero timing constraint violations, the mapping process ends.

Finally, after the logic function is fully mapped, a bit map is formed which is downloaded by the computer to a device programmer, which applies the bit map to the individual programmable elements of a target CPLID, thereby programming the CPLD to implement the logic function.

BRIEF DESCRIPTION OF THE DRAWINGS

These and other features, aspects and advantages of the present invention will become better understood with regard to the following description, appended claims, and accompanying drawings, where:

FIG. 3 is a simplified schematic diagram illustrating an input/output block of the CPLD shown in FIG. 1;

FIG. 4 is a simplified schematic diagram illustrating an interconnect matrix of the CPLD shown in FIG. 1;

DETAILED DESCRIPTION

The present programming method is directed to erasable programmable logic devices (CPLDs) incorporating function blocks made up of macrocells whose assigned product terms are selectively "exported" with adjacent macrocells.

The present programming method is described with particular reference to the XC9500 CPLD family manufactured by Xilinx, Inc. of San Jose, Calif. The present invention is not limited to the devices of the XC9500 CPLD family.

A brief description of the XC9500 CPLD family is provided below. Additional description of the XC9500 CPLD family is provided in *The Programmable Logic Data Book,* 1996, pp. 3–1 through 3–67, published by Xilinx, Inc., which incorporated herein by reference.

CPLD Structure

Figure 1:
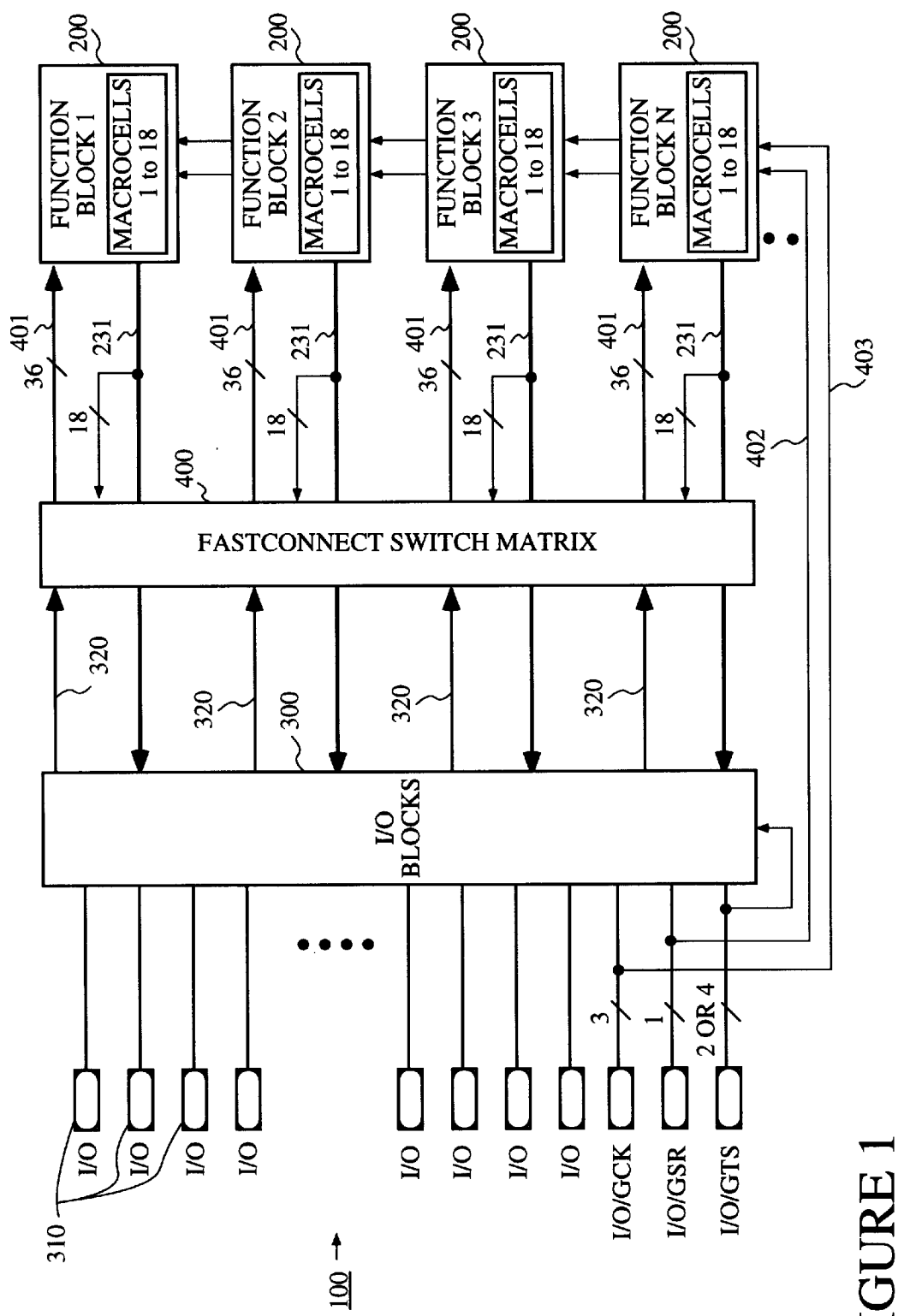
FIG. 1 is a circuit diagram showing a CPLD including multiple function blocks.

FIG. 1 shows a simplified block (diagram of a CPLD 100 which includes features common to the XC9500 CPLD family. Each CPLD 100 of the XC9500 CPLD family consists of multiple function blocks (FBs) 200 (four shown) and input/output blocks (IOBs) 300 which are interconnected by a FastCONNECT™ Switch Matrix (FSM) 400. The IOBs 300 provide buffering for device inputs and outputs which are applied to input/output (I/O) pins 310. All input signals from the IOBs 300 enter the FSM 400 on FSM input lines 320, and selected output signals from the FBs 200 are fed-back into the FSM 400 on macrocell output lines 231. Each FB 200 receives thirty-six (36) inputs on FB input lines 401 from the FSM 400 and produces ninety (90) P-term elements which are applied to an of eighteen (18) macrocells, each macrocell being programmable to provide a sum-of-products term from selected P-term elements. For each FB 200, twelve to eighteen outputs are selectively transmitted on macrocell output lines 231 to directly drive the I/O blocks 300 (along with optional corresponding output enable signals). In addition, each FB 200 selectively receives global set/reset signals and global clock signals on global set/reset lines 402 and global clock lines 403, respectively. The function and use of these global signals are discussed below.

Figure 2A:
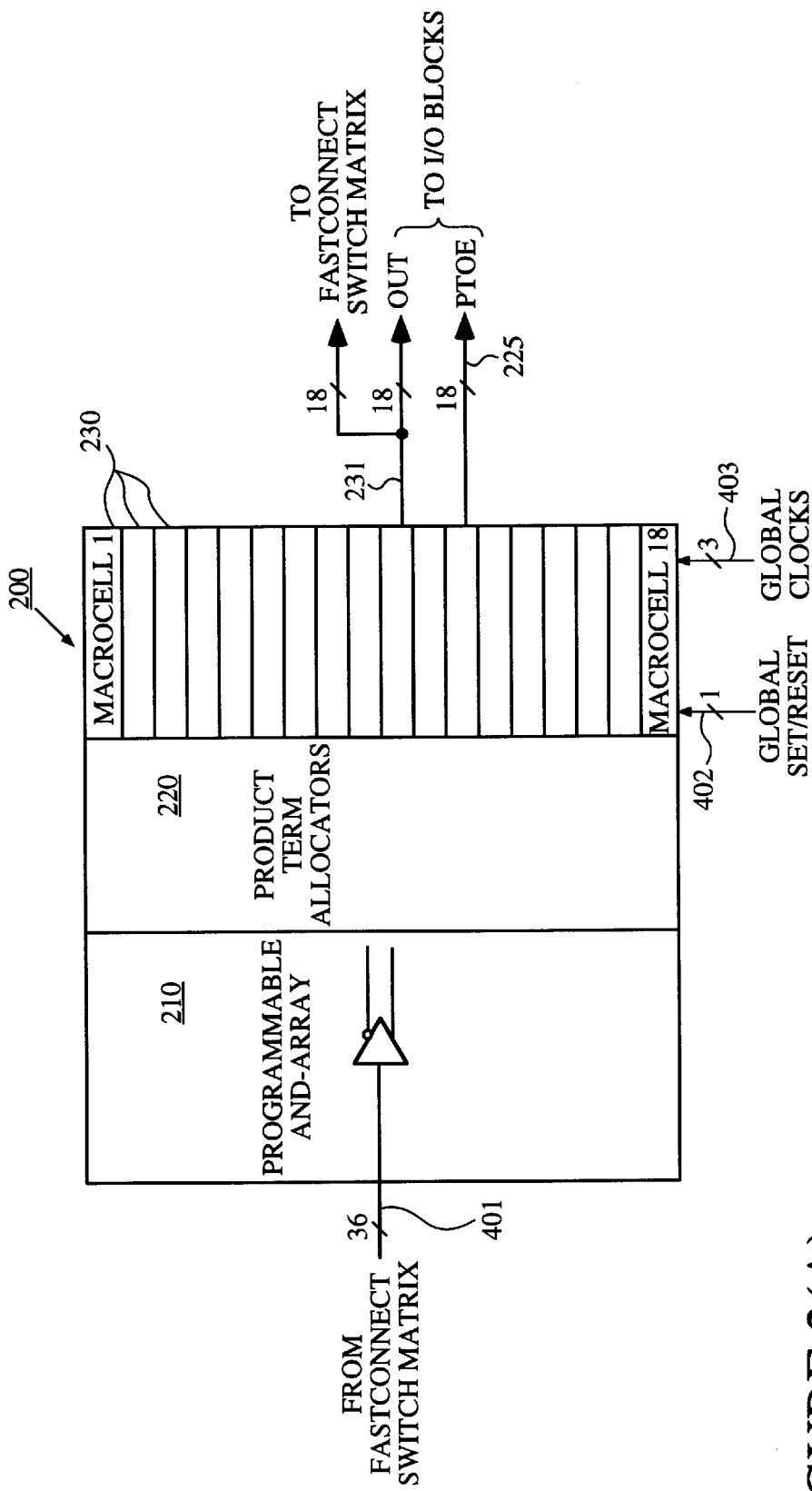
FIG. 2(A) is a simplified block diagram of a function block of the XC9500 CPLD family.

FIG. 2(A) shows a simplified block diagram of an FB 200. Each FB 200 includes an AND array 210, product term allocators 220 and eighteen macrocells 230. The AND array 210 receives thirty-six (36) signals on input lines 401 from the FSM 400 and generates ninety (90) P-term elements which are routed to the macrocells 230 through the product term allocators 220. The product term allocators 220 selectively route the P-term elements to the macrocells 230. Outputs from the macrocells 230 are then routed back to the FSM 200 on macrocell output lines 231 for use as input signals in other FBs 200, or are routed to corresponding I/O pins 310 through the IOBs 300 along with optional corresponding output enable (OE) signals, which are transmitted on P-term OE lines 225.

Figure 2B:
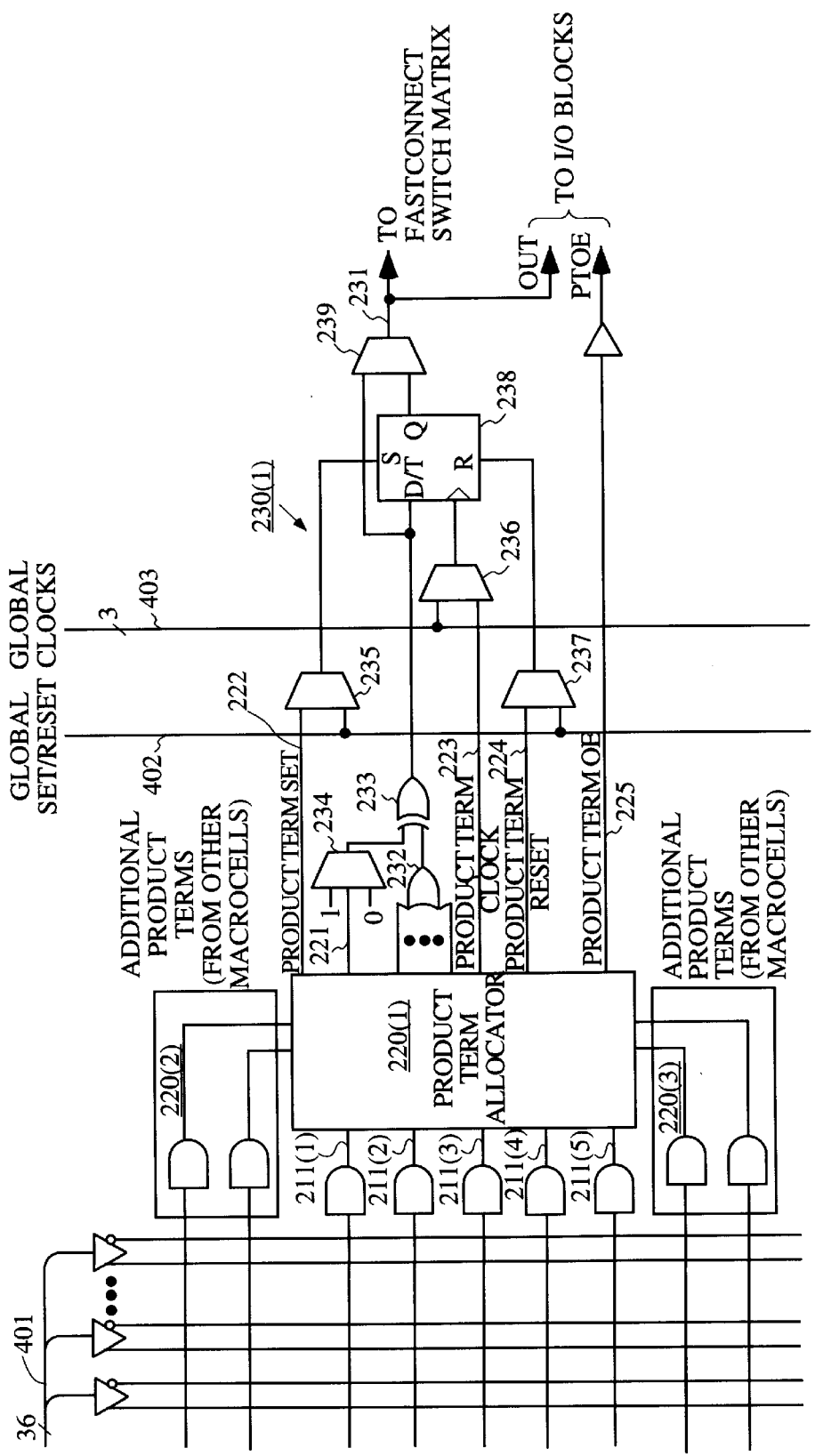
FIG. 2(B) is a simplified schematic diagram illustrating a macrocell of the function block shown in FIG. 2(A)

FIG. 2(B) shows a portion of an FB 200 including a macrocell 230(1). As indicated in FIG. 2(B) and discussed further below, the product term allocator 220(1) programmably connects five direct P-term elements 211(1) through 211(5) to provide the various P-term signals used by macrocell 230(1). In particular, these direct P-term signals are selectively applied to the OR gate 232, to the XOR gate 233 (on XOR MUX line 221 and through XOR MUX 234), to the set MUX 235 (on P-term set line 222), to the clock MUX 236 (on P-term clock line 223), to the reset MUX 237 (on P-term reset line 224), and to provide the optional OE signal (on P-term output-enable line 225). In addition, the product term allocator 220(1) selectively applies "imported" P-term elements from neighboring product term allocators 220(2) and 220(3) to the OR gate 232. Details of the product term allocator 220(1) are discussed below.

The XOR MUX 234 programmably applies the signal on XOR MUX line 221, a logic "1" or a logic "0" to the XOR gate 233. In addition, the OR gate 232 generates a sum-of-products term which is applied to the second input of XOR gate 233. The output of XOR MUX 234 is selectively transmitted through D/T flip-flop (D/T FF) 238 and FF MUX 239 as a registered output signal on macrocell output line 231, or directly through FF MUX 239 as a combinatorial output. The remaining P-term elements selectively provide optional control signals for the D/T FF 238 (when a registered output signal is generated), and/or provide optional OE control when the output is directed to an I/O pin 310 (FIG. 1). Specifically, the set MUX 235 selectively passes the signal on P-term set line 222 or a global set signal (received on one of the global set/reset lines 402) to the set (S) terminal of D/T flip-flop 238. The clock MUX 236 selectively passes the signal on P-term clock line 224 or a global clock signal (received on one of the global clock lines 403) to the clock (>) terminal of D/T flip-flop 238. The reset MUX 237 selectively passes the signal on P-term reset line 224 or a global reset signal (received on one of the global set/reset lines 402) to the reset (R) terminal of D/T flip-flop 238. Finally, as discussed above, the P-term OE line 225 is directed to the output blocks 300 (see FIG. 1).

Figure 2C:
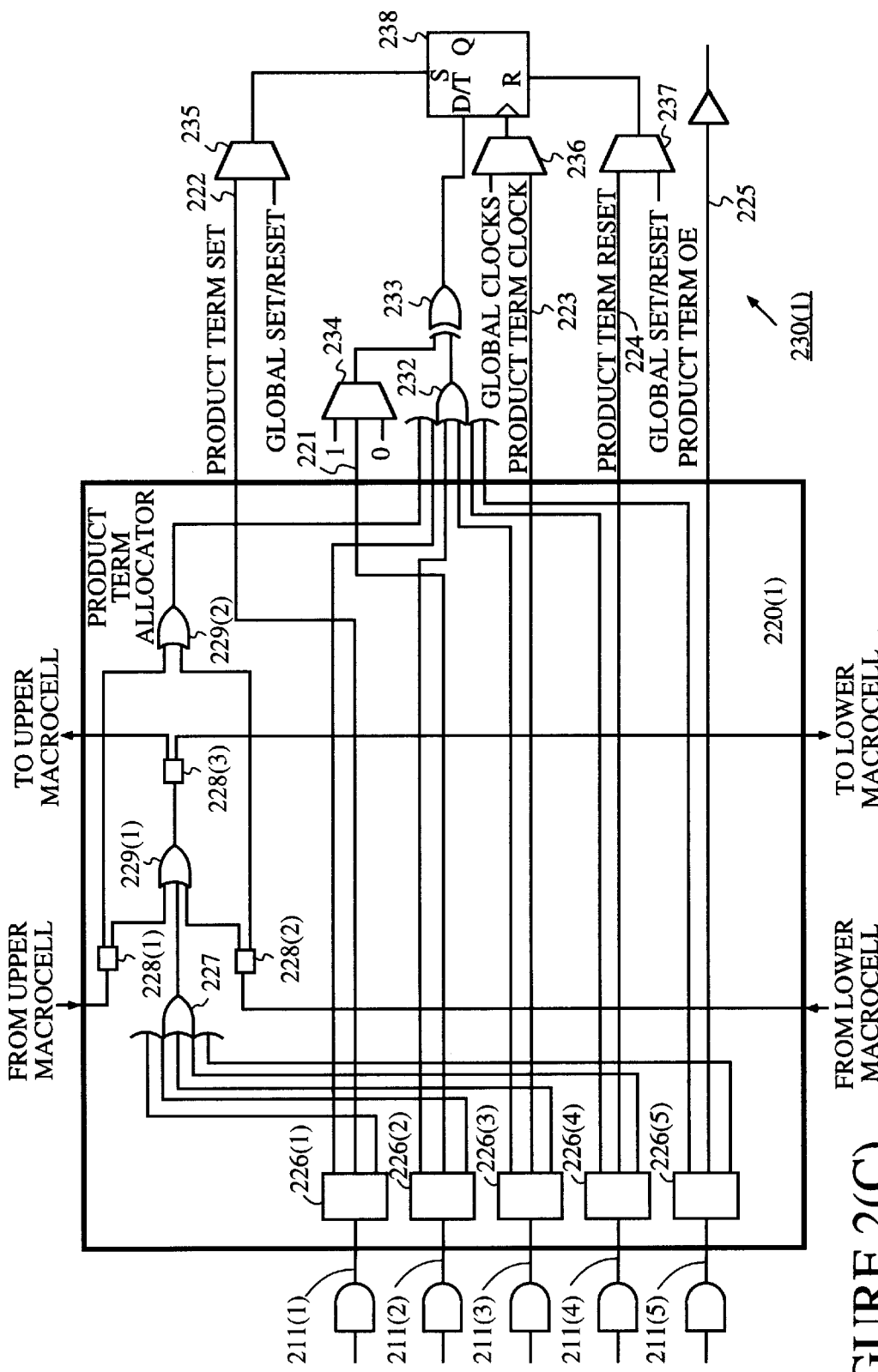
FIG. 2(C) is a simplified schematic diagram illustrating a product term allocation circuit of the function block shown in FIG. 2(A)

FIG. 2(C) is a simplified diagram showing the internal logic of the product term allocator 220. P-term elements 211(1) through 211(5) are respectively transmitted to de-multiplexers (DMUXs) 226(1) through 226(5). DMUXs 226(1) through 226(5) are programmable to route their associated P-term elements to any one of three lines: to an input of an OR gate 227 of the product term allocator 220(1), to an input of the OR gate 232 of the macrocell 230(1) associated with the product term allocator 220(1), or to an associated local P-term line (respectively, XOR MUX line 221, P-term set line 222, P-term clock line 223, P-term reset line 224 and P-term OE line 225).

P-term signals selectively transmitted by DMUXs 226(1) through 226(5) to the OR gate 227 are referred to herein as "exported" P-terms because these P-term signals are transmitted to other macrocells. Specifically, the P-term elements connected by DMUXs 226(1) through 226(5) to the OR gate 227 are "ORed" to produce a sum-of-products term which is applied to OR gate 229(1). OR gate 229(1) selectively "ORs" this sum-of-products term with terms received from either or both adjacent macrocells 220(2) and/or 220(3) (see FIG. 2(B)) which are received through DMUX 228(1) and/or DMUX 228(2), respectively. The output of OR gate 229(1) is then routed through DMUX 228(3) to either of the adjacent macrocells 220(2) or 220(3). As discussed below in additional detail, by selectively combining (ORing) selected P-term elements using the OR gates 227 of the product term allocator 220, it is possible to implement equations having up to ninety (90) P-terms.

As used herein, P-terms which are selectively transmitted to the specific P-term lines 221–225 are referred to as "local" P-terms because these P-terms can only be implemented "locally" (i.e., within their associated macrocell). That is, it is not possible to "import" any P-term from an adjacent macrocell to, for example, apply an asynchronous clock signal to the clock terminal of the D/T FF 238 of the associated macrocell.

In contrast to local P-terms, the term "logic P-term" is used herein to refer to P-terms whose output is applied to the OR gate 232 of a selected macrocell. As described in further detail below, the logic P-terms of an equation can be implemented "locally" by the P-terms assigned to a particular macrocell 230, or can be transmitted to the macrocell from one or more adjacent macrocells via the product term allocator 220.

FIG. 3 is a simplified circuit diagram showing connections between the macrocell 230(1) and a corresponding I/O pin 310(1) through a corresponding IOB 300(1). The IOB 300(1) includes an output enable (OE) MUX 301 through which an OE signal, provided by one of the P-term OE line 225, global OE lines 312(1) though 312(4), a logic "1" or a logic "0" is applied to the control terminal of a tri-state buffer 302. The global OE lines 312(1) through 312(4) are respectively driven by global OE MUXs 311(1) through 311(4), which in turn receive signals from special I/O pins 310(1) through 310(4). When the applied OE signal enables the tri-state buffer 302, a macrocell output signal on macrocell output line 231 is applied to the I/O pin 310(1). Conversely, when the tri-state buffer 302 is turned off, input signals applied to the I/O pin 310(1) are applied to the FSM 400 (see FIG. 1) on FSM input lines 320.

FIG. 4 is a simplified circuit diagram showing connections between function blocks 200(1) and 200(2), IOBs 300(2) and 300(1), and the FSM 400. An FSM input MUX 404 connects each of the function block output lines 231(1) and 231(2) to the FSM 400. FSM/macrocell input lines 405 carry first input FSM signals (true or compliment, depending upon the programmed state of the FSM input MUX 404) from the macrocells 230(1) and 230(2). Similarly, input signals from the IOBs 300(1) and 300(2) are respectively entered into the FSM 400 on FSM/IOB input lines 406. All of the FSM/macrocell input lines 405 and the FSM/IOB input lines 406 are programmably connected to each of the FSM output lines 401. In addition, the FSM 400 includes wired-AND 407 which ANDs together two or more signals entering the FSM on FSM/macrocell input lines 405.

Definitions

As described above, up to ninety (90) P-term elements of a given function block are usable by a single macrocell by programming the product term allocator to connect the five assigned P-term elements of the macro(ell and the eighty-five (85) remaining P-term elements of the function block to the OR gate 232 of the macrocell. However, in practical applications, the number of P-terms making up a given equation is typically much lower than ninety, t,hereby leaving numerous P-term elements available for implementing other equations of a user's logic function. The P-term mapping process according to the present invention addresses the issue of how the P-terms are assigned (mapped) to specific P-term elements of a CPLD in order to determine a placement arrangement of a logic function while minimizing time delays associated with signal propagation through the CPLD.

To facilitate the description of the key concepts associated with the P-term mapping process according to the present invention, the following definitions and graphic representations are adopted.

As used herein, the term "placing" refers to the process of assigning each equation to a macrocell 230 of a function block 220 of the target CPLD 100, and the term "mapping" refers to the process of assigning each P-term of an equation to one P-term element 211 associated with the macrocell 230 in which the equation is placed. The term "placement arrangement" refers to the final location of the equations after the placement and mapping processes are completed.

As used herein, the term "output equation" refers to an equation whose output is transmitted to an output pin 310 (see FIG. 1) of the CPLD 100. Conversely, the term "node equation" refers to an equation whose output is red back to the FSM 400.

As used herein, the term "locked equation" refers to an output equation whose output signal is constrained by a user to be applied to a specific I/O pin 310. Because each I/O pin 310 is uniquely connected to an associated macrocell 230, it is necessary to implement each locked equation in the macrocell 230 which is associated with the user-specified I/O pin 310. In contrast, a "non-locked equation" is either a node equation or an output equation where location of the associated output pin 310 is designated as "don't care" by the user.

Additional concepts and definitions are described in conjunction with FIGS. 5(A) through 6(F).

Figure 5A:
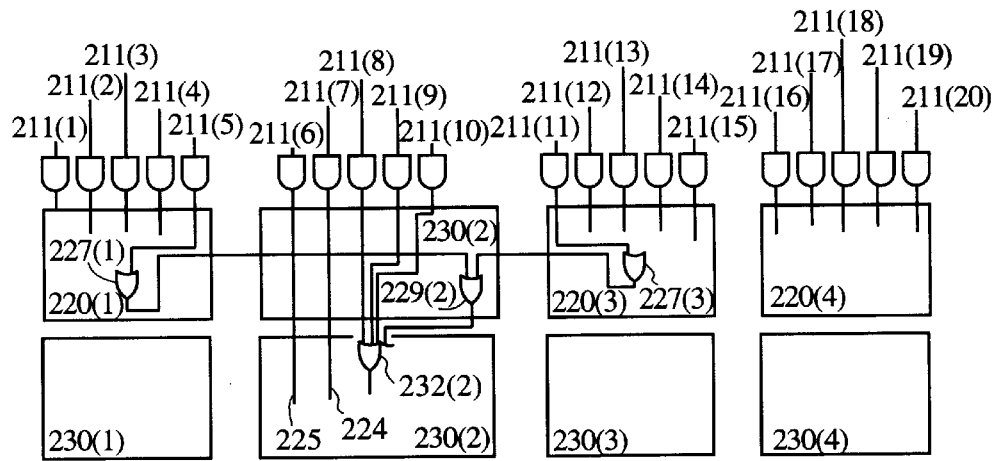
FIGS. 5(A) through 5(C) show a simplified circuit diagram illustrating an example of equation mapping in a CPLD.
Figure 5B:
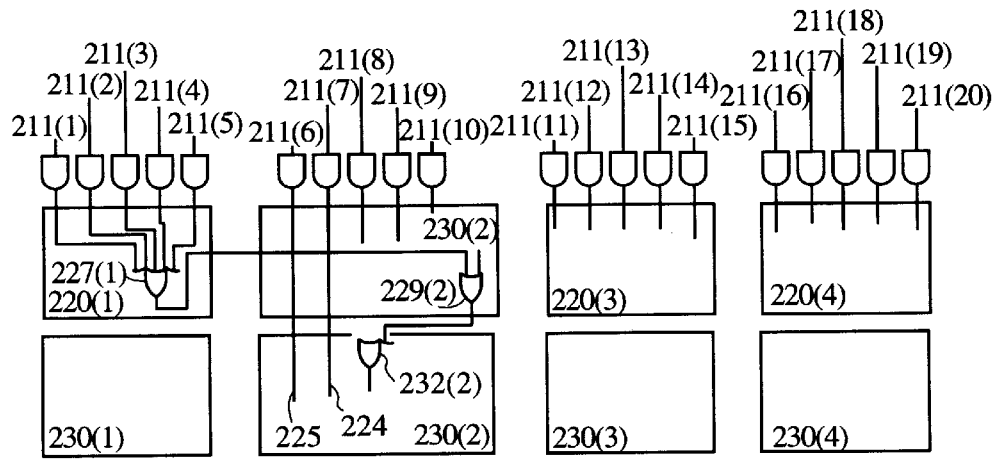
Figure 5C:
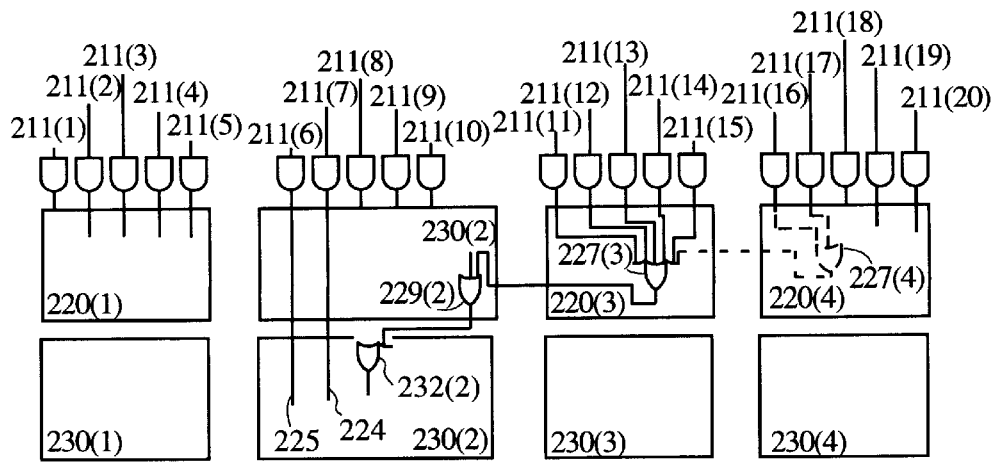

FIGS. 5(A) through 5(C) illustrate a simplified portion of a function block 200 of the CPLD 100 shown in FIGS. 1–4. Each of these figures includes a simplified block diagram including four macrocells 230(1) through 230(4) of an FB along with associated product term allocators 220(1) through 220(4) and P-term elements 211(1) through 211(20).

FIGS. 5(A)–5(C) show examples of how an equation is implemented by CPLD 100. The equation of this example includes a group of seven P-terms: five logic P-terms and two local P-terms. In these examples, the local P-terms are implemented by P-term element 211(6) (which is connected to P-term output enable line 225) and P-term element 211(7) (which is connected to P-term reset line 2241.

FIG. 5(A) shows a first example in which the group of P-terms of the equation is mapped in a "centered" position with respect to macrocell 230(2). The term "centered" indicates mapping of the equation such that the equation is symmetrically positioned relative to macrocell 230(2). In this example, the equation is implemented by the five P-terms assigned to macrocell 230(2) and one P-term from each of macrocells 230(1) and 230(3). Specifically, the equation is implemented by P-term elements 211(6–10) of macrocell 230(2), of which P-term elements 211(6) and 211(7) are implemented as the required "local" output enable and reset P-terms, respectively, and P-term elements 211(8), 211(9) and 211(10) are implemented as logic P-terms (i.e., applied to the OR gate 232(2)). In addition, the fourth and fifth logic P-terms of the equation are implemented by P-term element 211(5), which is transmitted from macrocell 230(1) to OR gate 232(2) via OR gate 227(1) and OR gate 229(2), and P-term element 211(11), which is transmitted from macrocell 230(3) to OR gate 232(2) via OR gate 227(3) and OR gate 229(2).

As used herein, the process of transmitting P-terms assigned to one macrocell to another macrocell is referred to as "exporting". In the example of FIG. 5(A), P-term elements 211(5) and 211(11) are exported from macrocells 230(1) and 230(3), respectively, to macrocell 230)(2) by programming the product term allocators 220(1) and 30)(3) to direct these P-terms to the OR gate 232(2) of macrocell 230(2).

FIG. 5(B) shows a second example of the equation shifted to the "left" relative to the "centered" position shown in FIG. 5(A). In this example, the equation is mapped so that the five P-terms assigned to macrocell 230(1) and the two local P-terms of macrocell 230(2) are utilized to implement the equation. Specifically, the equation is implemented by P-term elements 211(1–5) of macrocell 230(1), and by P-terms 211(6) and P-term 211(7) of macrocell 230(2). In this example, all five "logic" P-terms of the equation are exported from macrocell 230(1) to OR gate 232(2) via OR gate 227(1) and OR gate 229(2). Further shifting of the equation to the left is restricted by the equation's local P-terms. That is, local P-terms of a locked equation must be implemented in the designated macrocell—unlike logic P-terms of a locked equation, local P-terms cannot be imported from another macrocell.

FIG. 5(C) shows a third example of the equation shifted to the "right" relative to the "centered" position shown in FIG. 5(A). That is, the equation is rapped so that the five P-terms assigned to macrocell 230(3) and the two local P-terms of macrocell 230(2) are utilized to implement the equation. Specifically, the equation is implemented by P-term elements 211(11–15) of macrocell 230(3), and P-term elements 211(6) and 211(7) of macrocell 230(2). In this (example, all five "logic" P-terms of the equation are exported from macrocell 230(3) to OR gate 232(2) via OR gate 227(3) and OR gate 229(2).

Assuming the equation did not have any local P-terms, then the equation could be further shifted to the right such that P-term elements 211(16) and 211(17) are exported from macrocell 230(4) to implement the equation, as indicated in dashed lines in FIG. 5(C), via OR gate 227(4), OR gate 227(3) and OR gate 229(2). Of course, in this example, none of the P-term elements 211(6–10) of macrocell 230(2) would be utilized to implement the equation, thereby freeing all five of these P-term elements for exporting to macrocell 230(1).

Figure 5D:
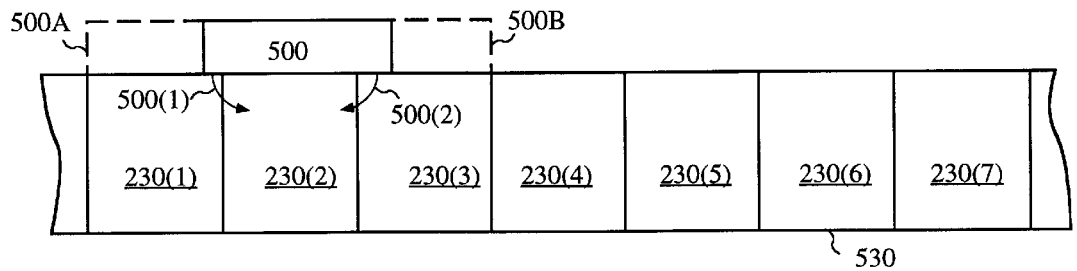
FIGS. 5(D) through 5(F) show a simplified graphical representation of the equation mapping examples shown in FIGS. 5(A) through 5(C)
Figure 5E:
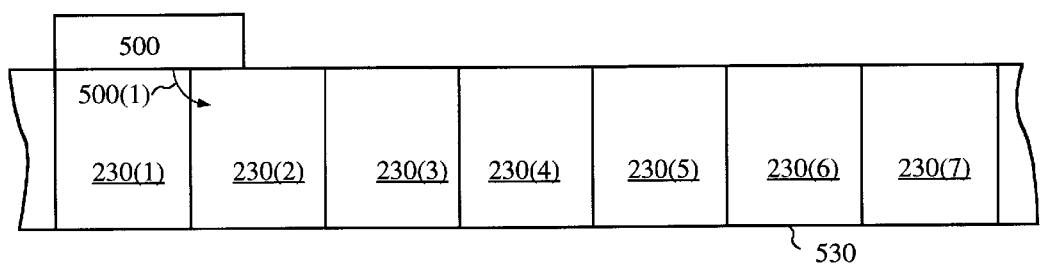
Figure 5F:
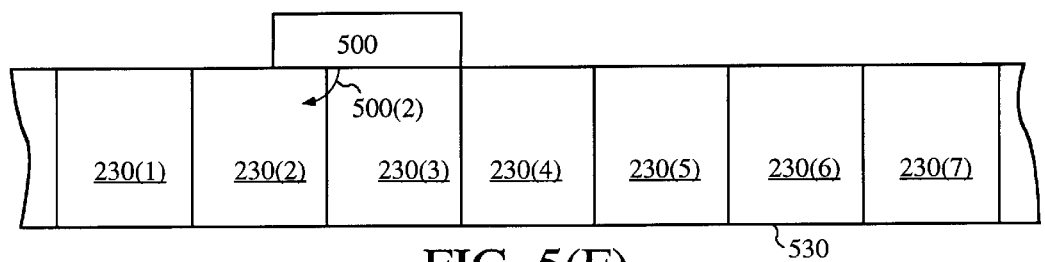

FIGS. 5(D) through 5(F) are simplified diagrams illustrating the mapping examples of FIGS. 5(A)–5(C), respectively. According to the simplified representation introduced in FIGS. 5(D)–5(F), the macrocells 230(1–4) are represented by sections of a continuous strip 530 which also includes macrocells 230(5–7). In addition, the equation mapped in FIGS. 5(A)–5(C) is represented by a block 500 in FIGS. 5(D)–5(F) whose position relative to the macrocell strip 530 indicates the equation's placement arrangement (i.e., the approximate position of the group of P-term elements implementing the equation are located under the block). For example, the "centered" placement arrangement of the equation shown in FIG. 5(A) is represented in FIG. 5(D) by block 500 which is centered over macrocell 230(2). Further, the leftward boundary of block 500 extends over a portion of macrocell 230(1), indicating that one of the equation is implemented by P-terms from both macrocells 230(1) and 230(2). The arrow 500(1) signifies that one or more P-terms are exported from macrocell 230(1) to macrocell 230(2). Likewise, the rightward boundary of block 500 extends over a portion of macrocell 230(3), indicating that the equation is also implemented by one or more P-terms assigned to macrocell 230(3). The arrow 500(2) indicates that the utilized P-terms of macrocell 230(3) are exported to macrocell 230(2).

As used herein, a "valid placement range" or "valid placement area" of an equation refers to the range of P-terms (corresponding to an area over the macrocell block 530) in which an equation can be mapped without violating any placement constraints associated with the target CPLD. Referring to the example shown in FIG. 5(D), the valid placement area of the equation is defined by the left-most boundary 500B (corresponding to P-term element 211(1) in FIG. 5(B)) and the right-most boundary 500A (corresponding to P-term element 211(15) in FIG. 5(C)). The valid placement range/area of an equation is indicated by a range (−x,+x), where the term "−x" corresponds to the left-most P-term of the range, and the term "+" corresponds to the right-most P-term of the range. Referring to FIG. 5(D), the valid placement area of equation 500 may therefore be designated as (211(1), 211(15)). A locked equation can be mapped anywhere within its valid placement range.

FIG. 5(E) illustrates the leftward-shifted placement arrangement of the equation of the example shown in FIG. 5(B). The leftward boundary of block 500 extends over the entire macrocell 230(1), indicating that all of the P-terms of macrocell 230(1) are utilized by the equation. The arrow 500(1) signifies that all of these P-terms are exported from macrocell 230(1) to macrocell 230(2).

Finally, FIG. 5(E) illustrates the rightward-shifted placement arrangement of the equation of the example shown in FIG. 5(C). The rightward boundary of block 500 extends over the entire macrocell 230(3), indicating that all of the P-terms of macrocell 230(3) are utilized by the equation. The arrow 500(2) signifies that all of these P-terms are exported from macrocell 230(3) to macrocell 230(2).

FIGS. 6(A) through 6(D) illustrate simplified graphic representations of P-term placement constraints which are present in the Xilinx XC9500 family of CPLDs.

Figure 6A:
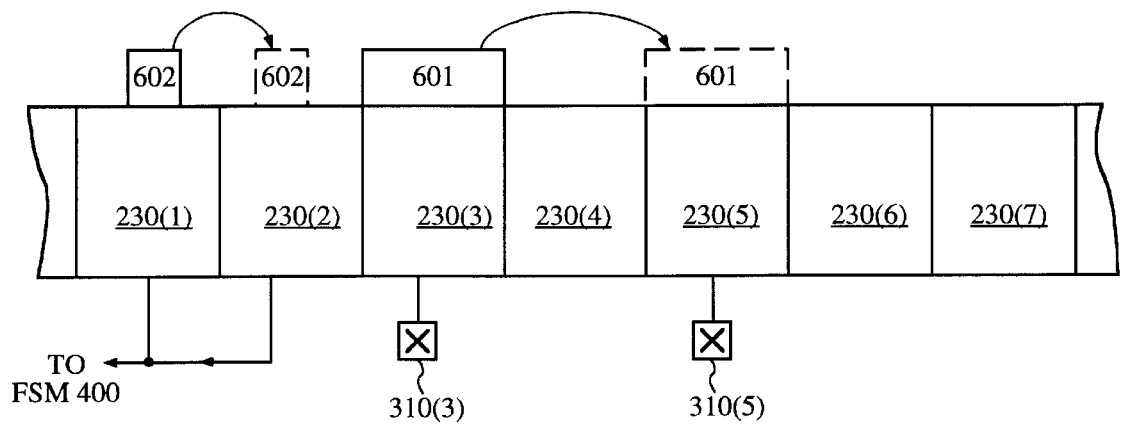
FIGS. 6(A) through 6(D) are simplified graphical representations showing placement constraints of a CPLD.

As defined above, an output equation is referred to as a "locked equation" when the output is "locked" to a particular macrocell. In the example shown in FIG. 6(A), the output equation 601 may be "locked" to macrocell 230(3)) if the equation's output must be applied to I/O pin 310(3). Alternatively, if equation 601 is "non-locked", the equation may be moved (re-mapped or shifted), if necessary, from the position shown in solid lines in FIG. 6(A) to another location, such as to macrocell 230(5), such that the equation's output is applied to I/O pin 310(5), as shown in FIG. 6(A) in dashed lines. Thus, locked equations are distinguished from non-locked equations in that non-locked output equations can be mapped in any available macrocell that is bonded to an I/O pin 310.

The mapping of locked equations in an XC9500 CPLD is subject to a "locked equation constraint". That is, because I/O pin 310(3) is connected to one an(i only one corresponding macrocell 230 (in this case, macrocell 230(3)), a locked equation is constrained to be implemented by that corresponding macrocell—if a locked equation cannot be mapped such that its output is directed through the corresponding macrocell, then a user's logic function will not be implemented as desired. As such, a valid placement arrangement of a logic function must meet the locked equation constraint by placing all locked equations in their respective corresponding macrocells.

In contrast to output and locked equations, a node equation is typically a non-locked equation whose output is directed back to the interconnect matrix of a host CPLD for use as an input signal in a subsequent equation. In the example shown in FIG. 6(A), the output of a node equation 602 is directed back to the FSM 400 (see FIG. 1) through macrocell 230(1). Because all of the macrocells of an XC9500 CPLD are typically connected to the FSM 400, node equations can be implemented anywhere on the CPLD, provided sufficient macrocell resources are available, such as in macrocell 230(2), as shown in dashed lines in FIG. 6(A).

Figure 6B:
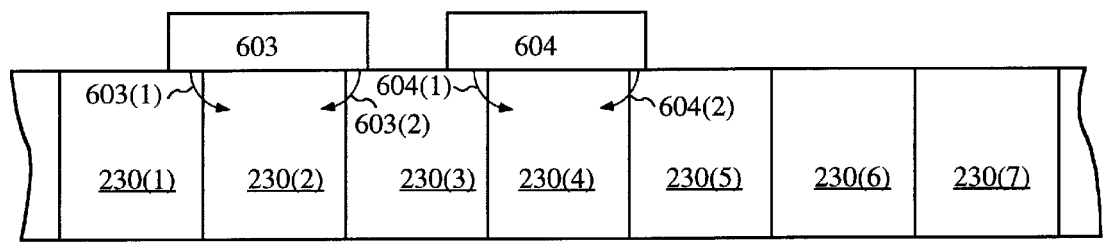

FIG. 6(B) illustrates a second placement constraint associated with XC9500 CPLDs which is referred to herein as the "bi-directional exporting" constraint. Referring briefly to FIG. 2(C), a feature of the product term allocator 220 of XC9500 CPLDs is that the DMUX 228(3) is programmable to only export P-terms to the left (upward in this figure) or to the right (downward), but not both in both directions. Referring back to FIG. 6(B), this restriction limits the use of P-terms associated with a macrocell (such as macrocell 230(3)), whose P-terms are utilized by a first equation 603 and a second equation 604. That is, because P-terns cannot be exported both to equation 603 (arrow 603(2)) and to equation 604 (arrow 604(1)) extending from the same macrocell 230(3), one of the equations 603 and 604 must be shifted away from macrocell 230(3) in order to attain a valid placement arrangement of both equations.

Figure 6C:
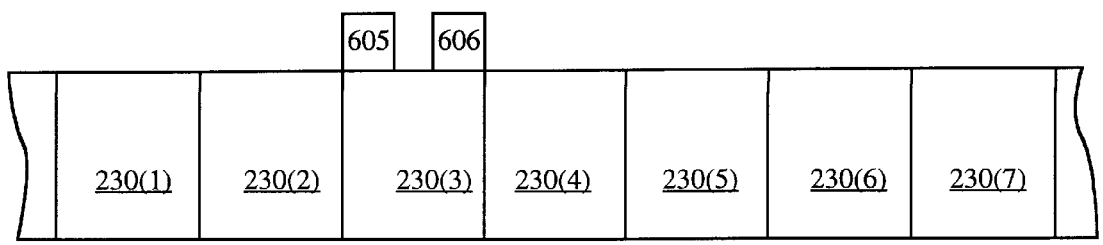

FIG. 6(C) illustrates a third placement constraint associated with XC9500 CPLDs which is referred to herein as the "macrocell output" constraint. Referring briefly to FIG. 2(B), a feature of each macrocell 230 of XC9500 CPLDs is that there is only one output signal (on line 231) (note that the output enable signal on P-term OE line 225 is not directed to either an I/O pin 310 or the FSM 400). Referring back to FIG. 6(C), this feature limits the use of a macrocell (such as macrocell 230(3)) to implement only one equation. For example, it is not possible to implement two small equations 605 and 606, each comprising two P-terms, in the macrocell 230(3) because macrocell 230(3) provides only one output. Therefore, although macrocell 230(3) includes sufficient P-terms to implement both equations 605 and 606, the "macrocell output" constraint prevents this implementation. In the example shown in FIG. 6(C), valid placement of a logic function requires shifting one of the equations 605 and 606 to another macrocell.

Figure 6D:
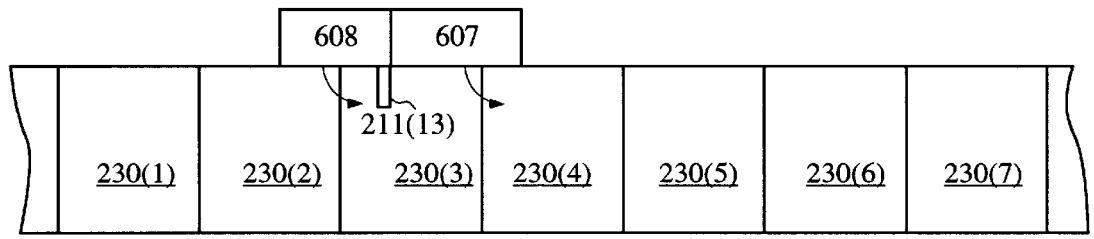

FIG. 6(D) illustrates a fourth placement constraint associated with XC9500 CPLDs which is referred to herein as the "local P-term" constraint. Referring briefly to FIG. 2(B), a feature of each macrocell 230 of the Xilinx XC9500 CPLDs is that each of the five P-terms assigned to the macrocell is the only connection for, for example, applying an asynchronous clock signal to the D/T flip-flop 238 (via P-term clock line 223). Referring back to FIG. 6(D), this feature prevents exporting a specific P-term when the P-term is designated as a local P-term. For example, it is not possible to export P-term element 211(13) to implement equation 607 when this P-term is used to transmit a P-term clock signal in equation 608. Therefore, although macrocells 230(3) and 230(4) include sufficient P-term elements to implement equation 607, even if some logic P-terms are exported to macrocell 230(2) to implement equation 608, the local P-term constraint prevents exporting P-term element 211(13) for this purpose. In the example shown in FIG. 6(D), valid placement of equations 607 and 608 requires exporting, for example, P-term elements 211(11), 211(12), 211(14) or 211(15), to implement the equation 607.

Figure 6E:
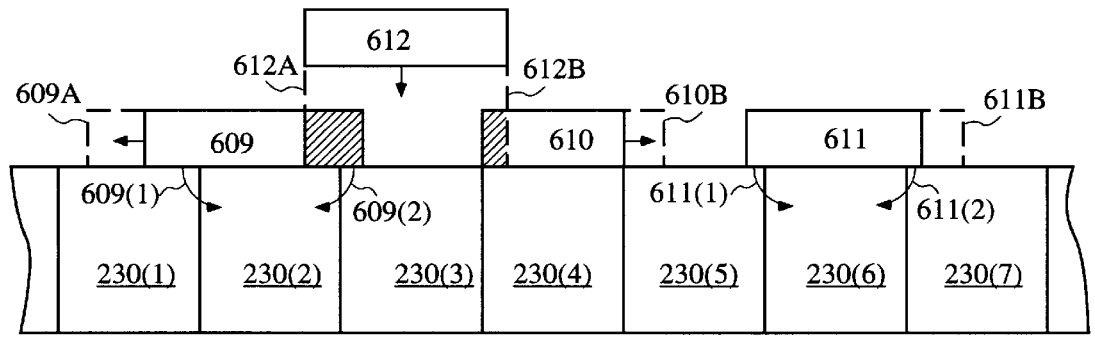
FIGS. 6(E) and 6(F) are simplified graphical representations showing equation "pushing"
Figure 6F:
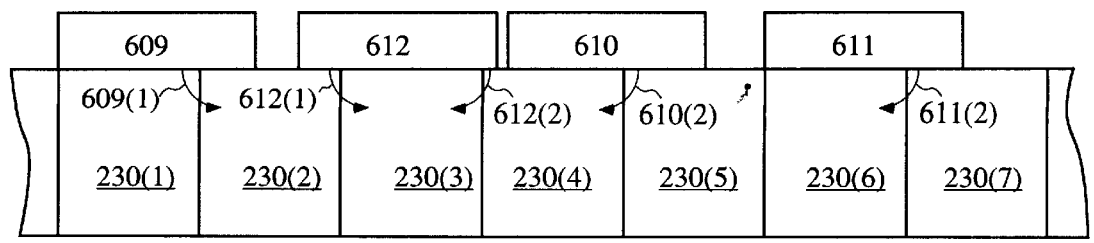

FIGS. 6(E) and 6(F) illustrate an example how equations are adjusted ("pushed") to make necessary P-term resources available for mapping an equation.

As shown in FIG. 6(E), locked equations 609, 610 and 611 are previously mapped, and locked equation 612 is an equation which is designated for implementation in macrocell 230(3). Mapped equation 609 is implemented in 230(2) and imports P-terms from macrocell 230(1) (indicated by arrow 609(1)), and from macrocell 230(3) (indicated by arrow 609(2)). In addition, the "–x" boundary of the valid placement area for equation 609 is indicated by dashed line 609A. Mapped equation 610 is implemented in 230(4), and the "+x" boundary of the valid placement area for equation 610 is indicated by dashed line 610B. Mapped equation 611 is implemented in 230(6) and imports P-terms from macrocell 230(5) (indicated by arrow 611(1)), and from macrocell 230(7) (indicated by arrow 611(2)). In addition, the "+x" boundary of the valid placement area for equation 611 is indicated by dashed line 611B.

As indicated by dashed lines 612A and 612B, mapping of equation 612 into the "slot" (area between equations) provided between equations 609 and 610 would not produce a valid placement because of the resultant "overlap" (concurrent use of specific P-terms in two or more equations) that this placement arrangement would produce. For example, in FIG. 6(E), the potential overlap of equation 612 on equations 609 and 610 is indicated by the shaded areas of equations 609 and 610. To map equation 612 between equations 609 and 610, it is necessary to re-position (re-map) equations 609 and 610 to free sufficient P-term resources to implement the equation 612.

As used herein, "pushing" refers to the process of adjusting an equation within its valid placement area in order to make P-term resources available for the mapping of an additional equation. The phrase "push to the left" refers to the process of pushing an equation is a first relative "direction" along the "line" of macrocells, and the term "push to the right" refers to the process of pushing an equation in a second relative "direction" which is opposite to the first direction.

A limitation on equation pushing is referred to herein as "blocking". Blocking occurs when, in order to map an equation, it is necessary to push a locked equation out of its valid placement area. That is, the locked equation blocks the pushing process because, if pushed out-side of the valid placement area, one or more placement constraints must be violated.

Referring again to FIG. 6(E), one method of eliminating the overlap between equations 609 and 612 is to push equation 609 to the left (in the direction of the arrow pointed toward boundary line 609A). Likewise, another method of eliminating the overlap between equations 610 and 612 is to push equation 610 to the right (in the direction of the arrow pointed toward boundary line 610B). Pushing equation 610 to the left requires the export of P-terms from macrocell 230(5) to macrocell 230(4). However, this adjustment violates the bi-directional exporting constraint (discussed above) because P-terms are already being exported from macrocell 230(5) into macrocell 230(6) to implement equation 611. Therefore, the process of mapping equation 612 also requires pushing equation 611 to the left (in the direction of the arrow pointed toward boundary line 611B).

FIG. 6(F) shows a placement arrangement of equations 609–612. Equation 609 is implemented in macrocell 230(2) and imports P-terms from macrocell 230(1) (indicated by arrow 609(1)). Equation 612 is implemented in macrocell 230(3), as required, and imports P-terms from macrocell 230(2) (indicated by arrow 612(1)) and from macrocell 230(4) (indicated by arrow 612(2)). Equation 610 is implemented in macrocell 230(4) and imports P-terms from macrocell 230(5) (indicated by arrow 610(2)). Finally, equation 611 is implemented in macrocell 230(6) and imports P-terms from macrocell 230(7) (indicated by arrow 611(2)). This placement arrangement is referred to by the term "zero-cost" because this solution does not violate any of the above-mentioned placement constraints. Specifically, all of the equations 603–612 are implemented in their designated macrocells (i.e., no locked equation constraint violations), no macrocell exports different P-terms to two macrocells (i.e., no bi-directional exporting constraint violations), none of the macrocells implements more than one equation (i.e., no macrocell output constraint violations), and none of the equations utilizes a P-term which is designated as a local P-term in another equation (i.e., no local P-term constraint violations).

Programming Method

A CPLD programming method according to the present invention will now be discussed.

System Context of the Invention

Figure 7:
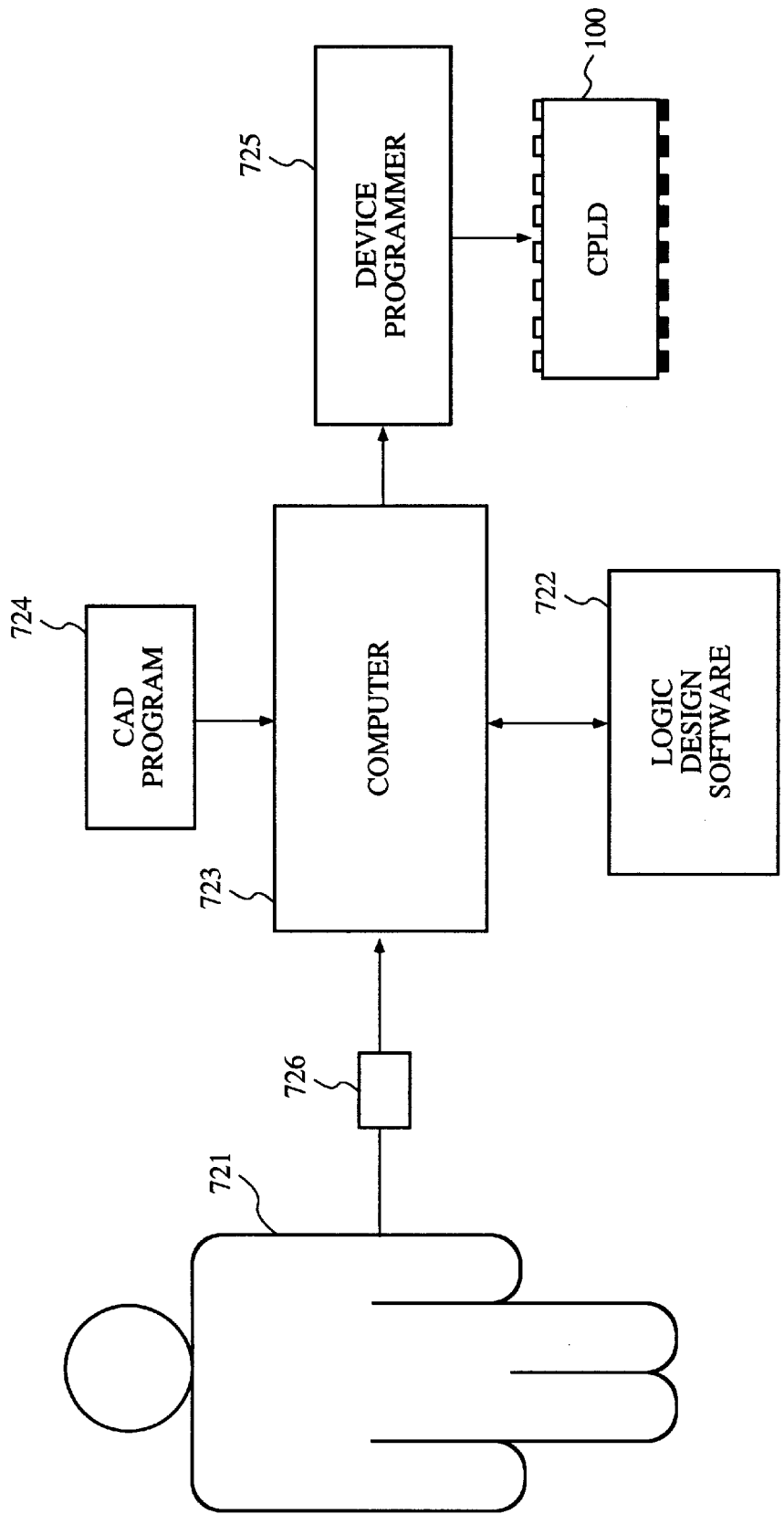
FIG. 7 is a block diagram illustrating a system from programming a CPLD using the P-term mapping method of the present invention.

FIG. 7 shows a "machine" for programming a CPLD 100 in accordance with the present invention. A human user 721 provides the CPLD 100 to be programmed and specifies the logic function (circuit design) which the CPLD 100 is to implement. Logic design software 722 and CAD software 724 (jointly referred to herein as the "high level program") operating in a computer 723 take the logic function specified by the user 721 and determine how to "map" the logic Efficiently onto the CPLD 100. Logic design software 722 is used to carry out the steps shown in FIGS. 8–11, and described further below. If the specified logic function is represented in a schematic or high-level language format, the logic design software 722 may be used to transform the function from that format to a set of Boolean sum-of-products equations prior to carrying out the steps in FIGS. 6–11. The set of Boolean equations includes both sequential (registered) equations and combinatorial equations. Such format transformation procedures are well known in the art and readily available. The programming method shown in FIGS. 6–11, however, discloses aspects particular to the present invention. The CAD software 724 is used after the logic design software 722, and produces a bit-map file that indicates to a device programmer 725 the values to program into the CPLD 100. This bit-map file, also known as a hex file, is a list of the programmable connections of the AND-array and OR-array of each function block, of the logic expander or interconnect matrix, and other setting of the CPLD 100. The device programmer 725 physically programs the contents of the bit-map file into the CPLD 100. The physical form of the programming or configuring depends on the manufacturing technology of the CPLD 100. If, for example, the CPLD 100 is an EPROM or EEPROM device, the EPROM or EEPROM cells are programmed by charging or discharging a floating gate or other capacitance element. Other PLD devices may be programmed using similar device programmers by blowing fuses. One device programmer 25 that may be used is the HW-130 available from Xilinx, Inc. of San Jose, Calif. It connects to computer 23 via an RS232 serial port. A software driver, which is provided for the HW-130 by Xilinx, Inc., downloads programs and data from the computer 23 to the device programmer 25. Thus, the interacting elements 21–25 of the machine in FIG. 7 carry out a process that reduces the CPLD 100 from an unprogrammed state to programmed state that can carry out the specified logic function.

Mapping Process Overview

Figure 8:
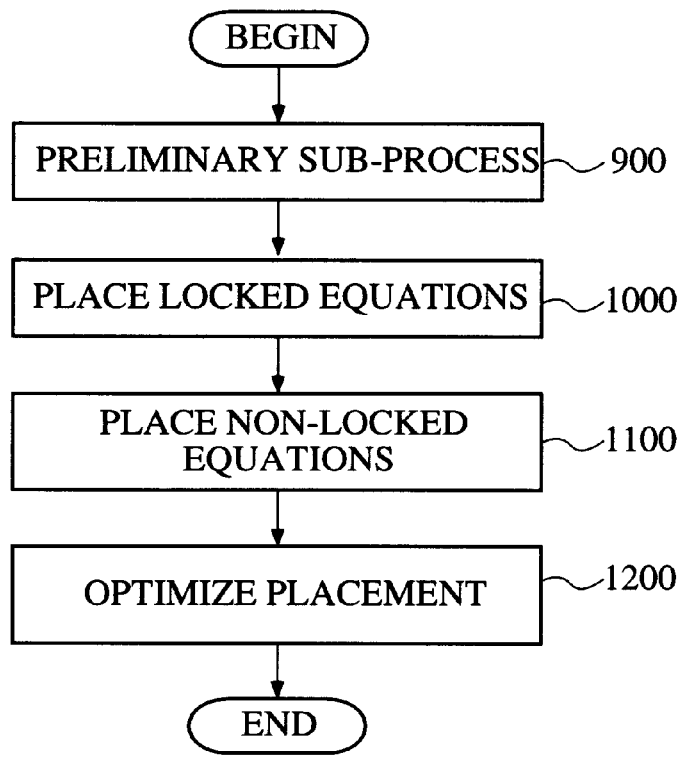
FIG. 8 is a flow diagram showing the basic steps of the P-term mapping process according to the present invention.

FIG. 8 is a flow diagram illustrating the basic steps used in the P-term mapping process in accordance with the present invention. The basic steps include a preliminary sub-process (step 900), locked equation mapping (step 1000), non-locked equation mapping (step 1100), and time-constraint optimization (step 1200). Each of these steps is discussed in additional detail below.

Figure 9:
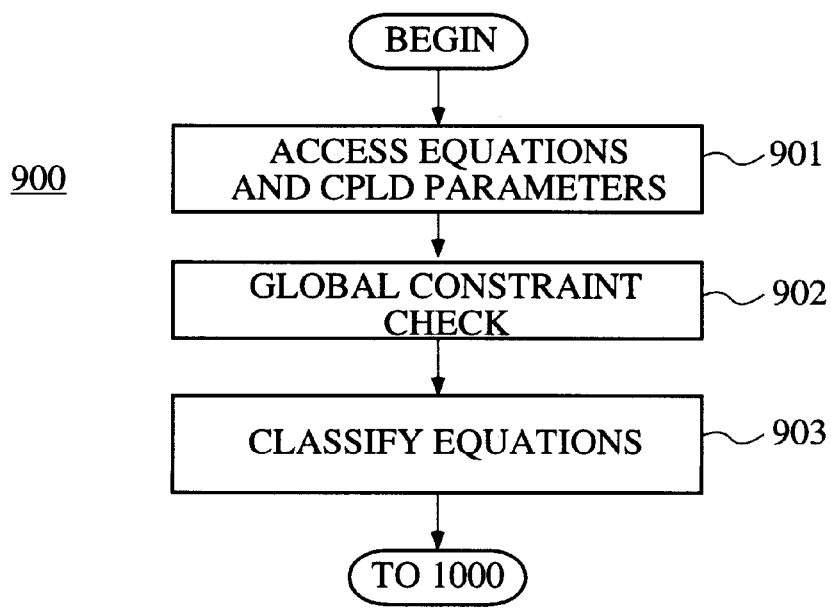
FIG. 9 is a flow diagram showing preliminary steps associated with the P-term mapping process according to the present invention.

Preliminary Sub-Process (FIG. 9)

The preliminary sub-process (step 900) includes the steps of accessing a set of equations to be placed in a target CPLD, along with information regarding the target CPLD (step 901), checking whether the global constraints of the target CPLD are adequate to implement the equation set. (step 902), and then classifying the equations of the equation set as "locked" and "non-locked" equations (step 903). These preliminary sub-process steps provide a context for the following mapping process (steps 1000, 1100 and 1200, discussed below). One of ordinary skill in the art would understand that one or more of the preliminary sub-process steps (steps 901–903) may be implemented by the high level program (for example, the step of classifying equations may be performed during or after logic optimization). In addition, the global constraints check (step 902) may be omitted.

As shown in FIG. 9, the accessing step (step 901) includes retrieving the equation set from the high level program along with parameters associated with the target CPLD (e.g., a CPLD from the Xilinx XC9500 family of devices). Examples of the types of parameters assigned to each equation and to the target CPLD which are used by the mapping process will now be described.

As discussed above, a user's logic function is optimized (divided) into a set of equations by the high level program incorporating the present method. Logic optimization is performed by an optimization program in accordance with established and well-known practices. After logic optimization, each equation of the equation set is identified by a number of parameters. The equation parameters of particular importance to the present mapping process include: each equation's type (node or output); whether each equation is assigned to a particular output location (device I/O pin); each equation's size (in number of P-terms); the number of local P-terms associated with each equation; and the timing criticality (timing constraints) assigned to each equation.

The definitions of "output equation" and "node equation" are provided above. The assignment of an equation to a particular I/O pin of the target CPLD determines the equations status as being "locked". The definition of "locked equation" is provided above. The definitions of "logic P-term" and "local P-term" are also discussed above. The "size" of each equation is determined by the total number of P-terms associated with the equation (that is, the sum of all local P-terms and logic P-terms). As discussed above, the number of local P-terms is used to establish thee valid placement area of each equation. Finally, the timing criticality of each equation is determined either by user-defined performance constraints or by high level program.

The description of the target CPLD (e.g., a Xilinx XC9500 CPLD) typically includes: the number of I/O pins (this is determined by, among other things, the device package); the position of each macrocell connected to each I/O pin; the total number of P-term elements and the total number of macrocells.

As indicated in FIG. 9, the optional global constraint check (steps 902) is performed before beginning the mapping process to determine whether the target CPLD has sufficient resources to implement the equation set. This "rough" placement check is intended to avoid wasted time seeking a mapping solution for when a target CPLD is too "small" to implement the equation set. An example of a global constraint check includes: determining whether the number of macrocells of the target CPLD is greater than the number of equations in the equation set; determining whether the number of P-term elements of the target CPLD is greater than the sum of P-terms of all equations in the equation set; and determining whether the total number of I/O pins of the target CPLD is greater than the total number of output equations in the equation set. If any of the global restraints is violated, then, for example, an error message is printed t:o alert the user, and control is returned to the high level program for selection of a new target CPLD having sufficient re(sources to implement the user's function.

A final step of the preliminary sub-process is to designate all of the equations in the equation set as "locked" or "non-locked". As used herein, a locked equation is an output equation whose output signal is designated by a user for application (transmission) to a particular I/O pin of the CPLD. In accordance with the XC9500 (PLD architecture, this "locked" classification necessitates implementation of each locked equation in a specific macrocell of the CPLD whose output is connected to the designated I/O pin. However, due to the XC9500 CPLD architecture, even though an equation is "locked", the P-terms making up the locked equation may be implemented in neighboring macrocells without violating the I/O pin requirement. Therefore, although the output of each locked equation must pass through a particular macrocell, there is some flexibility in the placement arrangement of the logic P-terms of each locked equation. In contrast to locked equations, a non-locked equation is either an output equation not designated to a particular I/O pin (i.e., the user doesn't care where the output is generated), or a node equation (i.e., an equation whose output is fed-back into the FSM for use in a subsequent equation).

Figure 10:
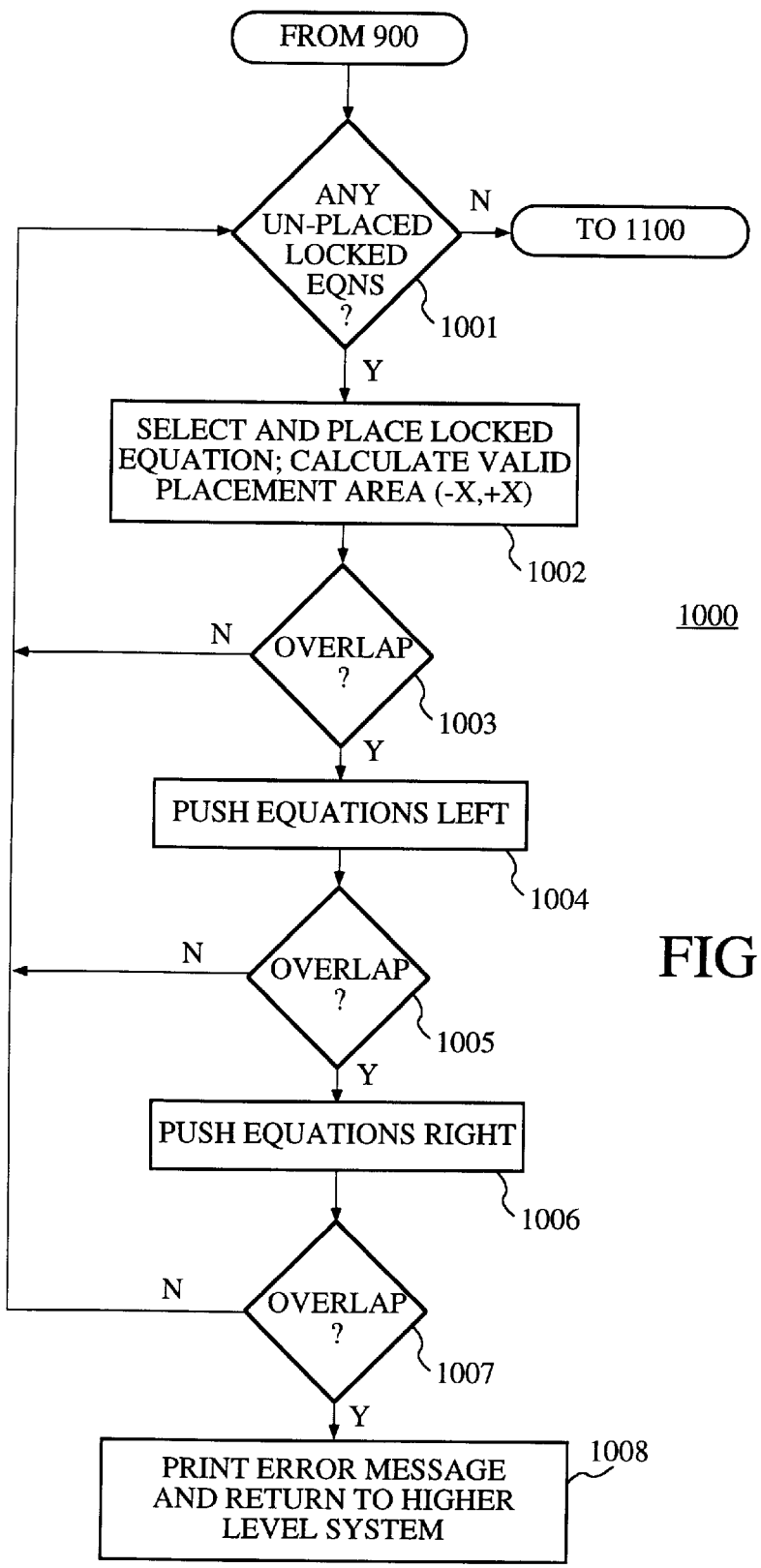
FIG. 10 is a flow diagram showing a sub-process for mapping locked equations of a logic function.

Locked Equation Mapping (FIG. 10)

FIG. 10 illustrates the locked equation mapping sub-process (step 1000) in accordance with the mapping process of the present invention.

The locked equation mapping sub-process includes the steps of: determining whether any un-mapped locked equations exist in the equation set (step 1001), selecting and mapping a locked equation in its designated location and computing a valid placement area (step 1002), determining if the mapped equation overlaps a previously-mapped equation (step 1003), attempting to remove the overlap by pushing equations to the "left" (step 1004), again determining the overlap persists (step 1005), attempting to remove the overlap by pushing equations to the "right" (step 1006), again determining the overlap persists (step 1007), and returning to the high level program if the overlap cannot be removed (step 1008). Each of these steps is discussed in additional detail below.

In step 1001, the equation set is reviewed to determine whether any locked equations remain un-mapped. As mentioned above, each equation includes a "locked" or "non-locked" designation. Step 1001 includes searching the equation set for equations having the "locked" designation, and determining whether the locked equations have been mapped. If there are no locked equations, or if all locked equations have been mapped, then control is passed to step 1100 (FIG. 11(A)). Conversely, if un-mapped locked equations are identified, control passes to step 1002.

In step 1002, one of the locked equations is selected, its valid placement area is calculated, and the locked equation is mapped within the valid placement area. Determining which un-mapped locked equation to map first is inconsequential because all locked equations must be mapped in their valid placement area in order to successfully place the logic function. The valid placement area (−x,+x) for the selected locked equation is then calculated. As defined above with respect to FIG. 5(D), the valid placement area defines the range in which the locked equation can be mapped without violating any of the placement constraints associated with the target CPLD. In accordance with the present invention, the valid placement area for a selected locked equation is determined by the following relationship:

$$(-x,+x)=(-((BWi-\#lpterms)+MW/2), +((BWi-\#lpterms+MW/2)),$$

where BW is the number of P-terms of the locked equation, #lpterms is the number of local P-terms of the locked equation, and MW is the number of P-terms available for the macrocell. Once the valid placement area is computed, the selected locked equation is temporarily mapped in a central location within the calculated valid placement area.

In step 1003, the central placement arrangement of the selected locked equation is analyzed to determine if the locked equation overlaps any previously-mapped equations. The concept of overlap is described above with respect to FIG. 6(E). Of course, the first equation mapped in the CPLD will not encounter any overlap problems. The first equation is therefore always mapped in the center of its calculated valid placement area without any overlap. Overlap may also be avoided when the mapped equation is sufficiently spaced from any previously mapped equations. In these instances, control is passed to step 1001. However, if any overlap is detected, control is passed to step 1004.

In step 1004, the process performs a first attempt to eliminate the overlap by pushing the overlapped equation to the left and attempting to map the selected equation in the resulting slot (within the equation's valid placement area). Of course, the amount of displacement of the overlapped equation is limited by that equation's valid placement area or by an adjacent equation's valid placement area—in other words, the "push" may be blocked. The concepts of pushing and blocking are described above with respect to FIG. 6(E).

In step 1005, the success or failure of the first attempt to eliminate the overlap in step 1004 is analyzed. If the overlap was successfully eliminated, then control passes back to step 1001. Otherwise, control passes to step 1006.

In step 1006, a second attempt to eliminate the overlap condition entails pushing previously mapped equations to the right and attempting to map the equation in the resulting slot (within the valid placement area).

In step 1007, the success or failure of the second attempt to eliminate the overlap is analyzed. If the overlap was successfully eliminated, then control passes back to step 1001. Otherwise, control passes to step 1008.

If control passes to step 1008, this indicates that a user's logic equation cannot be placed in the target CPLD because any placement arrangement would violate the locked equation constraints (described above with respect to FIG. 6(A)). This situation may arise, for example, where several large equations are locked into adjacent macrocells. Step 1008 can include, for example, returning control to the high level program. At this point, the high level program will determine whether an alternative solution to the problem is available, such as by buffering one or more of the equations. Buffering of an equation by the high level program entails breaking the equation into two or more smaller equations which can be separated—i.e., into one "locked" equation which fits into the available space, and one or more "non-locked" equations which can be placed into another area of the CPLD. Another alternative is simply to notifying the user that the target CPLD will not implement the logic function as defined, thereby allowing the user to either change the logic function or select another target CPLD.

Figure 11A:
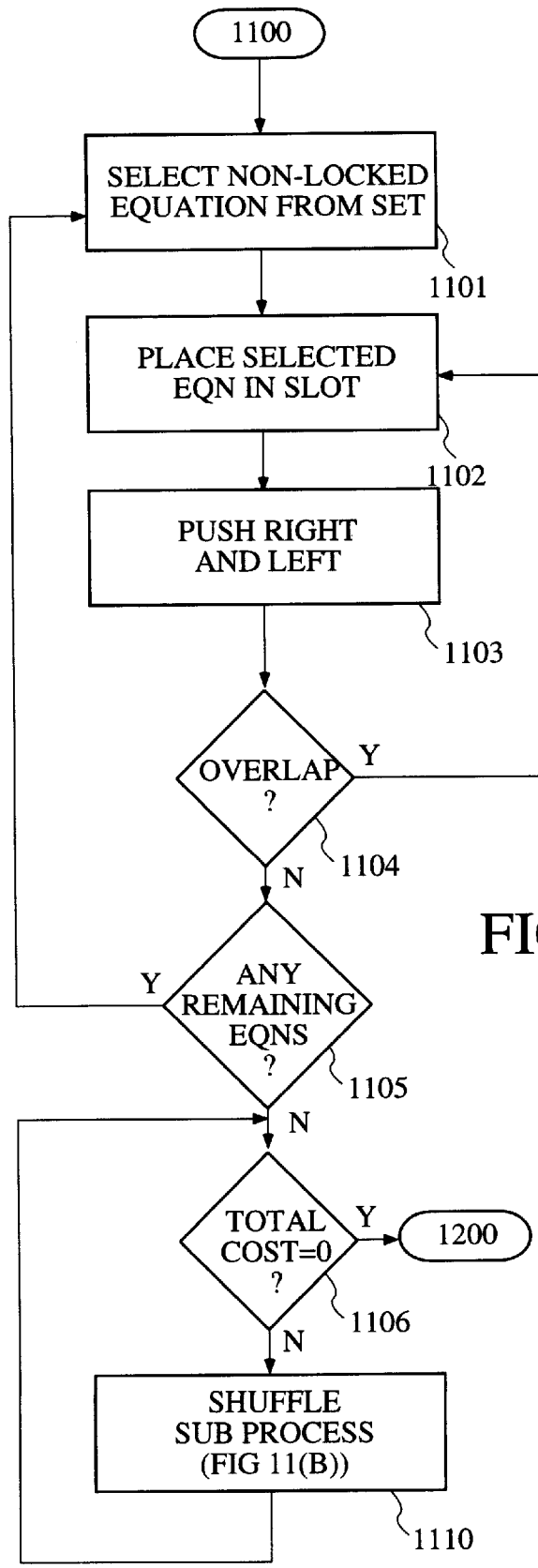
FIG. 11(A) is a flow diagram showing a sub-process for mapping non-locked equations of a logic function.
Figure 11B:
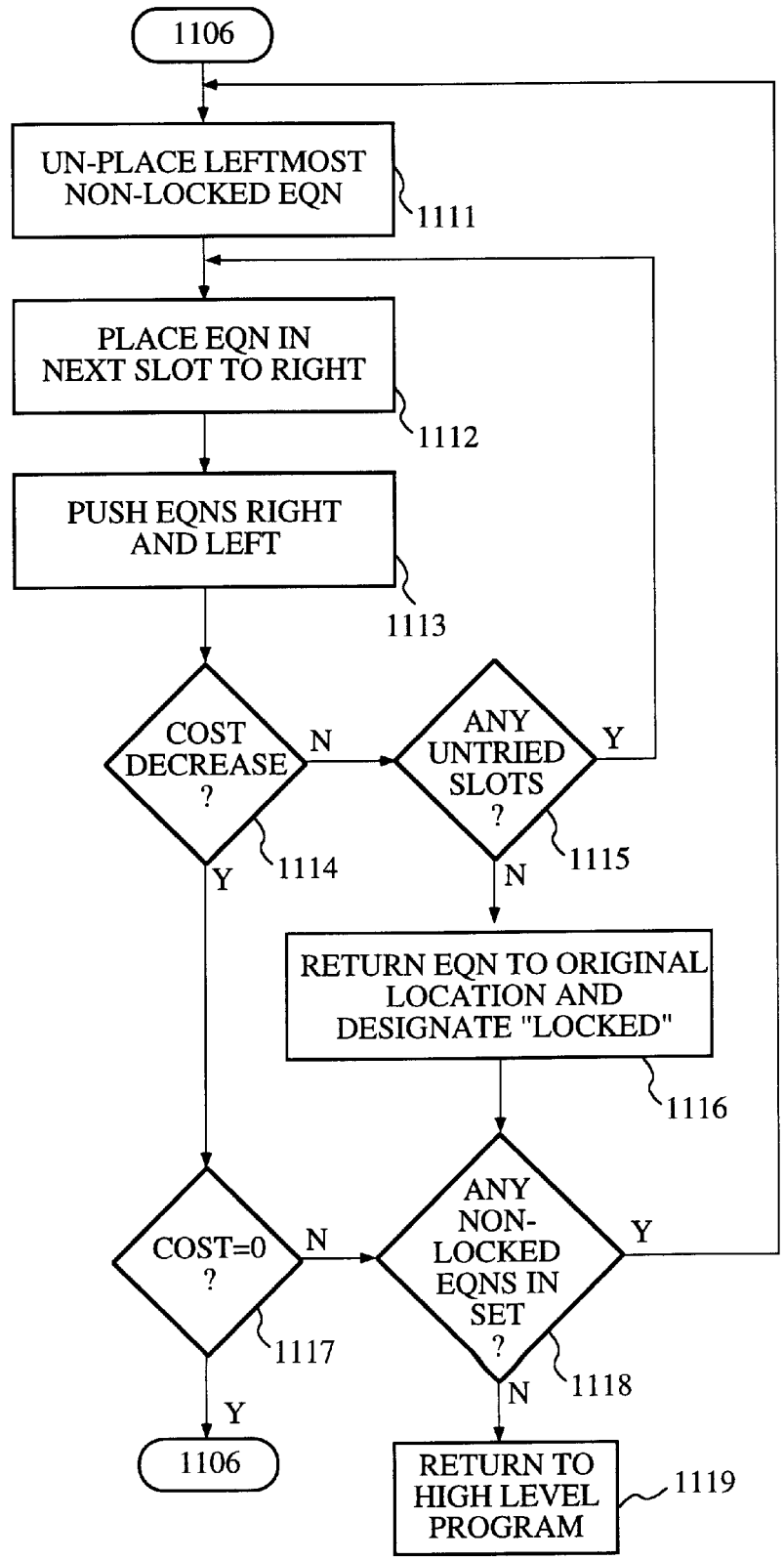
FIG. 11(B) is a flow diagram showing a sub-process for shuffling non-locked equations to achieve a valid mapping arrangement.
Figure 11C:
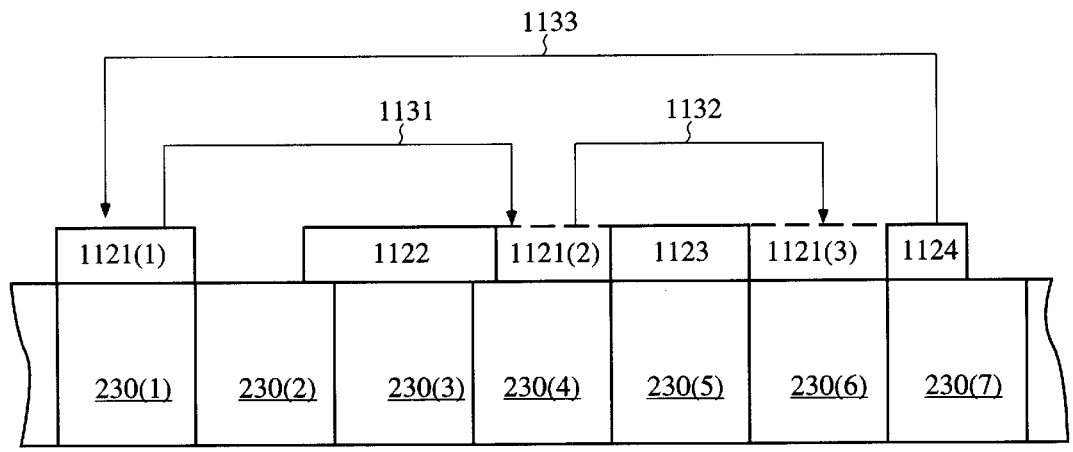
FIGS. 11(D) through 11(E) are simplified graphical representations showing equation "shuffling"

Non-Locked Equation Mapping (FIGS. 11(A) through 11(C)

Once the locked equations are mapped, control of the mapping process is transferred the mapping of non-locked equations (step 1100). As mentioned above, non-locked equations may include both output equations whose associated output pin 310 is not designated by the user, and node equations.

Referring to FIG. 11(A), in step 1101, a non-locked equation is selected from set of un-mapped equations. The criteria used to determine the order of selection may vary. One such criteria would be to map all non-locked output equations before the node equations. Another criteria may be based on the size (number of P-terms) of the equations, or by the number of local P-terms of the equations.

In step 1102, the mapping process attempts to map the selected equation in a selected available slot. The selected available slot is identified, for example, by selecting a datum (such as macrocell 220(1) in FIG. 5(A)), and identifying the first slot occurring to the right of the datum. Obviously, other methods for selecting a slot would occur to those of ordinary skill in the art. The selected equation is temporarily mapped in the slot in, for example, a central location between the two equations defining the slot. Because non-locked equations have and essentially infinite valid placement area, this placement arrangement is anywhere in slot.

In step 1103, an attempt is made to eliminate any overlap between the selected equation and the previously-mapped equations defining the slot. Step 1103 employs pushing the previously-mapped equations both right an left in manner similar to that described above with respect to steps 1004 and 1006 (see FIG. 10).

In step 1104, if an overlap persists after pushing the previously-mapped equations, control of the mapping process is passed to step 1102 (the selected equation is mapped in a new slot) and step 1103 (pushing is again (attempted). The loop including steps 1102, 1103 and 1104 is repeated until a slot is located into which the selected equation is mapped. Although not shown, if the equation cannot be mapped into any of the slots, then control is returned to the high level program. If the selected equation is mapped into a slot, the loop ends and control is passed to step 1105.

In step 1105, the mapping process checks the equation set and determines whether any non-locked equations remain un-mapped. If any un-mapped equations remain in the equation set, control returns to step 1101 for selection of a new equation, and the loop (steps 1102, 1103 and 1104) is repeated for this new equation. After all equations in the equation set are mapped, control passes to step 1106.

In step 1106, the resulting placement arrangement is analyzed to determine whether any of the four placement constraints exist. Specifically, all of the locked equations are checked to ensure they are implemented in their designated macrocells (i.e., no locked equation constraint violations). In addition, the placement arrangement is analyzed for bi-directional exporting constraint violations, macrocell output constraint violations, and local P-term constraint violations. Each placement constraint violation is given a cost of 1. The total cost for the placement arrangement is then calculated by summing all violations. If the calculated total cost for the placement arrangement is zero (i.e., there are no placement constraint violations), then control passes to sub-process 1200. If the total cost is greater than zero, then control passes to the shuffle sub-process 1100.

FIG. 11(B) is a flow diagram illustrating the steps associated with the shuffle sub-process 1110.

In step 1111, the left-most non-locked equation (based on a selected datum) is un-mapped (i.e., removed from its placement arrangement as of step 1106). Of course, right-most or largest non-locked equation can be selected during this step.

In step 1112, the selected equation is temporarily re-mapped in a slot located between the two equations adjacent the selected equation's original position. This step is illustrated in FIG. 11(C). Left-most equation 1121 is removed from its original location (indicated as 1121(1)) and re-mapped between adjacent equations 1122 and 1123 (as indicated by arrow 1131).

In step 1113, if the shuffled equation overlaps any previously-mapped equations, the previously-mapped equations are pushed right/left in an attempt to eliminate the overlap. For example, referring to FIG. 11(C), after shuffling equation 1121 to location 1121(2), if an overlap exists with either of equations 1122 and 1123, these equations are pushed right and left, respectively, in an attempt to (eliminate the overlap.

In step 1114, the effect of shuffling the equation is determined. Namely, the total cost of the placement arrangement is re-calculated and compared with the placement cost prior to the move. If the total placement cost is decreased by the move, control is passed to step 1117. If the total placement cost increases or remains the same, then control passes to step 1115.

In step 1115, the shuffling sub-process determines whether re-mapping of the selected equation has been attempted for slot. If there are slots which have not been tried, then control returns to step 1112, and steps 1113 and 1114 are repeated. This step is illustrated in FIG. 11(C) as movement of equation 1121 from position 1121(2) to 1121(3), and is indicated by arrow 1132. When the equation has been shuffled into every possible slot, control is passed to step 1116.

In step 1116, the shuffling sub-process re-maps the selected equation back into its original location and designates the equation as "locked", thereby indicating that no cost decrease is realized by shuffling the selected equation. This step is illustrated in FIG. 11(C) as movement of equation 1121 from position 1121(3) to original position 1121(1), and is indicated by arrow 1133. Control is then passed to step 1118.

As mentioned above with respect to step 1114, if the result of a shuffle step decreases the total cost for a placement arrangement, control is passed to step 1117. In step 1117, the total cost of the placement arrangement is calculated and, if equal to zero, control is returned to step 1106 (see FIG. 11(A)). However, if the cost is not zero, then control is passed to step 1118.

Figure 11D:
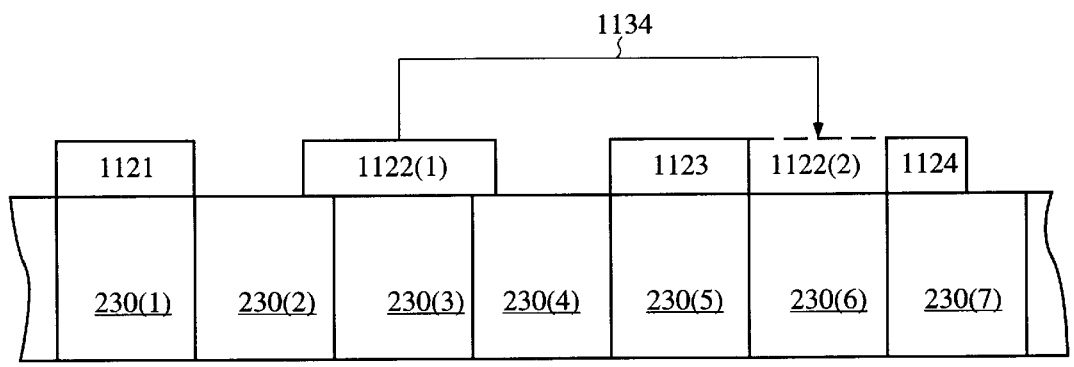

In step 1118, the shuffling sub-process determines whether any non-locked equations exist in the equation set. If so, control is passed to step 1111 and the process is repeated for the next left-most equation. For example, as shown in FIG. 11(D), equation 1122 is selected and shuffled between equations 1123 and 1124 (as shown by arrow 1134). This process is repeated until there are no more non-locked equations in the equation set. At this time, if the cost is greater than zero, then control is returned to the high level program (step 1119).

Figure 12:
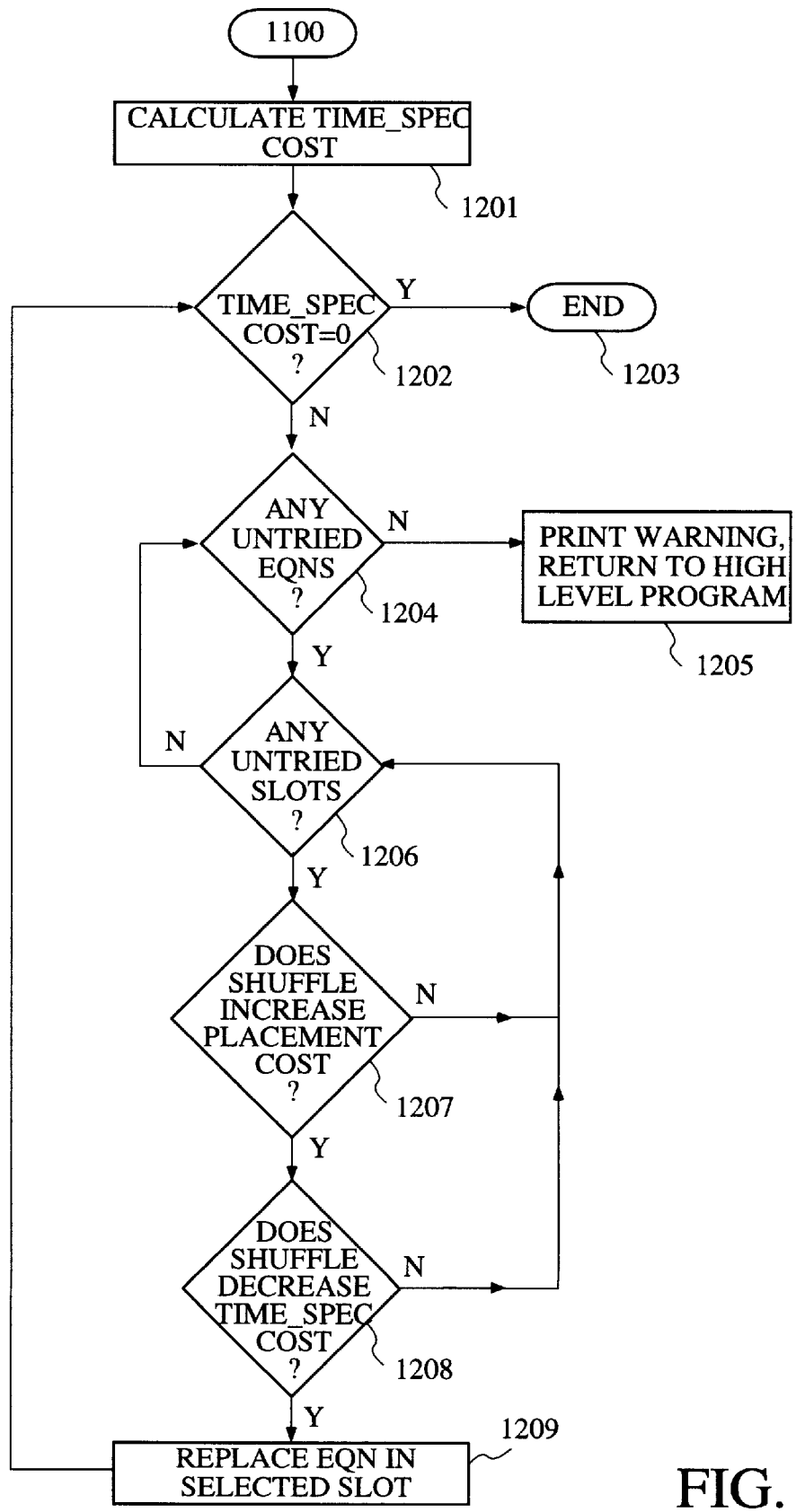
FIG. 12 is a flow diagram showing a sub-process for adjusting equation mapping to optimize timing.

Timing Optimization (FIG. 12)

As mentioned above, each equation is assigned a timing constraint which, to this point in the process, has not been considered in the placement analysis. In other words, to this point in the mapping process, the goal has been to identify a valid placement arrangement (i.e., which does not violate any placement constraints). Typically, the task of identifying a valid placement arrangement is relatively easy in comparison to the task of identifying a valid placement arrangement which meets all of a user's timing constraints. However, the user-defined timing constraints are often arbitrarily set, and therefore represent desired goals rather than practical limitations on a logic design implementation. Therefore, the present mapping process seeks first to identify a valid placement arrangement (steps 900, 1000 and 1100), and then attempts to modify the placement arrangement, if necessary, to meet the timing constraints (step 1200). It is the goal of the timing optimization sub-process to adjust the valid placement obtained in steps 1000 and 1100, if necessary, to meet the user-defined (or otherwise-defined) timing constraints.

FIG. 12 is a flow diagram showing the steps associated with the timing optimization sub-process.

In step 1201, the total timing specification violation cost is calculated. In this calculation, every P-term violating the timing constraints is assigned a cost of one. The total timing specification violation cost is therefore equal to the number of P-terms of the logic function which violate the timing constraints.

In step 1202, if timing specification cost is zero, then control is passed back to the high level program with a successful placement arrangement (step 1203). If the timing specification cost greater than zero, then control is passed to step 1204.

In step 1204, the set of equations having P-terms which violate timing constraints is analyzed to identify any non-locked equations which have not been shuffled. If all equations having timing constraint violations has been shuffled and no placement arrangements are identified in which the timing specification cost is zero, then an error message is generated indicating this condition and control is passed to the high level program (step 1205). If any of these equations have not been shuffled, then one of these equations is selected and control is passed to step 1204. According to one embodiment of the present mapping process, the equations having timing constraint violations are sorted and the equation having the highest timing constraint cost is selected first. The timing constraint cost of each equation is calculated, for example, by summing the number of P-terms of the equation which violate timing constraints. Alternatively, the timing specification cost may be determined using a weighing system where the difference between the actual timing specification and the target timing specification is considered for each P-term. After an equation is selected using one of these criteria, control is passed to step 1206.

In step 1206, if the selected equation has been shuffled into every slot of the placement arrangement and the timing specification cost cannot be reduced by shuffling, then control passes back to step 1204 for selection of a new equation. If the selected equation has not been shuffled into a slot, the selected equation is temporarily re-mapped into the slot in a manner similar to that of step 1102 (see FIG. 11(C)). Control then passes to step 1207.

In step 1207, an initial analysis is performed to determine whether the placement cost is increased by the shuffle. As discussed above, any valid placement arrangement must include a zero placement cost value. Therefore, if the shuffle increases the placement cost, control is returned to step 1206 for selection of a new slot. If the temporary placement arrangement does not increase the total placement cost, then control is passed to step 1208.

In step 1208, a second analysis is performed to determine whether the timing specification cost is decreased by the shuffle. If the shuffle increases or maintains the timing specification cost, control is returned to step 1206 for selection of a new slot. If the temporary placement arrangement decreases the total placement cost, then control is passed to step 1209.

In step 1209, the selected equation is permanently mapped in the slot such that the total timing specification cost is reduced. Control is then passed back to step 1202 to determine if the completed shuffling step reduces the total timing specification cost to zero. If not, steps 1204 through 1209 are repeated until either a placement arrangement is found or it is determined that the established timing constraints cannot be met.

Conclusion

Although the present invention has been described in considerable detail with reference to certain preferred embodiments thereof, other embodiments are possible. For example, the execution order of some of the described subroutines can be rearranged without changing the results. In addition, the placement constrain s associated with the disclosed target CPLD structure may be eliminated by utilizing a more complex product term allocator circuit of the target CPLD. Therefore, the spirit and scope of the appended claims should not be limited to the description of the preferred embodiments contained herein.

We claim:

1. A method for programming a programmable logic device to implement a logic function, the programmable logic device including a function block having an AND array for generating a plurality of product term elements, a plurality of macrocells and a product term allocator, the method comprising the steps of:

dividing the logic function into a set of equations, each equation including one or more product terms which are mappable into the product term elements of the function block;

mapping a locked equation of the equation set by assigning the locked equation to a first group of product term elements, and by generating programming data for controlling the product term allocator, wherein the product term allocator is connected between the AND array and the plurality of macrocells and is programmable to route a selected product term element signal to any of the plurality of macrocells, wherein each macrocell has an OR gate programmably connected to the product term elements from the AND array through the product term allocator, and wherein product term element signals generated by the first group of product term elements are routed by the product term allocator to a first macrocell in response to the programming data;

mapping non-locked equations of the equation set by assigning each non-locked equation to a second group of product term elements, and by modifying the programming data such that product term element signals generated by the second group of product term elements assigned to each non-locked equation are respectively routed to an associated second macrocell in response to the programming data;

shuffling locations of the mapped equations to eliminate placement constraint violations by adjusting the programming data;

creating a bit map whose contents are defined by the placement arrangement produced after the step of shuffling, the placement arrangement including said adjusted programming data; and transmitting the bit map to the programmable logic device such that the programmable logic device is programmed to implement the logic function in accordance with the bit map.

2. The method according to claim 1, wherein the step of mapping locked equations comprises determining a valid placement range of product term elements for each locked equation, the valid placement range including a series of said product term elements into which said locked equation is mappable wherein an output signal of said locked equation is generated by its associated predetermined macrocell.

3. The method according to claim 2, wherein the step of mapping locked equations further comprises:

mapping a first equation between a second equation and a third equation, wherein the second equation is assigned to a third group of product term elements and the third equation is assigned to a fourth group of product term elements; and adjusting the product term elements assigned to each of the first, third and fourth groups such that each product term element of the function block is assigned to only one equation, and each of the first, third and fourth groups includes product term elements of its associated valid placement range.

4. The method according to claim 3, wherein the step of adjusting the product term elements assigned to each of the first, third and fourth groups comprises pushing one of the second and third equations such that a number of product term elements separating the third and fourth groups is increased, thereby freeing sufficient product term elements for mapping the first equation.

5. The method according to claim 2, wherein the step of mapping non-locked equations further comprises mapping a non-locked equation into an associated second group of product term elements located between third and fourth groups of product term elements respectively assigned to second and third equations, and re-assigning the third and fourth groups of product term elements until each product term element of the function block is assigned to only one equation.

6. The method according to claim 5, wherein the step of adjusting the third and fourth groups comprises pushing one of the third and fourth groups such that a number of product term elements separating the third and fourth groups is increased, thereby freeing sufficient product term elements for mapping the non-locked equation.

7. The method according to claim 1, wherein the step of shuffling further comprises temporarily reassigning the product term elements associated with a first non-locked equation from a second group of product term elements to a third group of product term elements, the second group of product term elements being located between fourth and fifth groups of product term elements respectively assigned to second and third equations, and the third group of product term elements being located between the fifth group of elements and a sixth group of elements assigned to a fourth equation.

8. The method according to claim 7, wherein the step of shuffling further comprises:

determining if the re-assignment from the second group to the third group reduces the number of placement constraint violations; if the temporary re-assignment the second group to the third group reduces the number of placement constraint violations, permanently re-assigning the second group to the third group; and if the temporary re-assignment the second group to the third group does not reduce the number of placement constraint violations, permanently assigning the first non-locked equation to the second group.

9. A method according to claim 1, wherein the method further comprises a second shuffling step for shuffling locations of the equations to eliminate timing constraint violations before the step of creating a bit map.

10. The method according to claim 9, wherein the second shuffling step further comprises:

temporarily re-assigning the product term elements associated with a first non-locked equation from a second group of product term elements to a third group of product term elements, the second group of product term elements being located between fourth and fifth groups of product term elements respectively assigned to second and third equations, and the third group of product term elements being located between the fifth group of elements and a sixth group of elements assigned to a fourth equation;

determining if the re-assignment from the second group to the third group increases the number of placement constraint violations;

if the temporary re-assignment from the second group to the third group increases the number of placement constraint violations, permanently assigning the second equation to the first group; and if the temporary re-assignment from the second group to the third group does not reduce the number of placement constraint violations, permanently re-assigning the second group to the third group if the temporary re-assignment from the second group to the third group reduces the number of timing constraint violations.

11. A method for programming a programmable logic device to implement a logic function, the programmable logic device including a function block having an AND array for generating a plurality of product term elements, a plurality of macrocells and a product term allocator, the method comprising the steps of:

dividing the logic function into a set of equations, each equation including one or more product terms which are mappable into the product term elements of the function block;

mapping a locked equation of the equation set by assigning the locked equation to a group of product term elements, and by generating programming data for controlling the product term allocator, wherein the product term allocator is connected between the AND array and the plurality of macrocells and is programmable to route a selected product term element signal to any of the plurality of macrocells, wherein each macrocell has an OR gate programmably connected to the product term elements from the AND array through the product term allocator, and wherein product term element signals generated by the group of product term elements are routed to a first macrocell in response to the programming data;

shuffling locations of the mapped equations to eliminate placement constraint violations by adjusting the programming data;

creating a bit map whose contents are defined by the placement arrangement produced after the step of shuffling, the placement arrangement including said product term allocator programming data; and transmitting the bit map to the programmable logic device such that the programmable logic device is programmed to implement the logic function in accordance with the bit map;

wherein the step of mapping comprises determining a valid placement range of product term elements for each locked equation, the valid placement range including a series of said product term elements into which said locked equation is mappable wherein an output signal of said locked equation is generated by its associated predetermined macrocell.

12. The method according to claim 11, wherein the step of mapping locked equations further comprises mapping a first equation between a second equation and a third equation, and adjusting the product term elements assigned to each of the first, second and third equations, respectively, until each product term element of the function block is assigned to only one equation, and each of the first, second and third groups includes product term elements of its associated valid placement range.

13. The method according to claim 12, wherein the step of adjusting the product term elements assigned to each of the first, second and third equations comprises pushing one of the second and third equations such that a number of product term elements separating the second and third groups is increased, thereby freeing sufficient product term elements for mapping the first equation.

14. A method for programming a programmable logic device to implement a Logic function, the programmable logic device including a function block having an AND array for generating a plurality of product term elements, a plurality of macrocells and a product term allocator, the method comprising the steps of:

dividing the logic function into a set of equations, each equation including one or more product terms which are mappable into the product term elements of the function block;

mapping an equation of the equation set by assigning the equation to a group of product term elements, and by generating programming data for controlling the product term allocator, wherein the product term allocator is connected between the AND array and the plurality of macrocells and is programmable to route a selected product term element signal to any of the plurality of macrocells, wherein each macrocell has an OR gate programmably connected to the product term elements from the AND array through the product term allocator, and wherein product term element signals generated by the first group of product term elements are routed to a first macrocell in response to the programming data;

shuffling locations of the mapped equations to eliminate placement constraint violations by changing the programming data;

creating a bit map whose contents are defined by the placement arrangement produced after the step of shuffling; and transmitting the bit map to the programmable logic device such that the programmable logic device is programmed to implement the logic function in accordance with the bit map;

wherein the step of mapping equations further comprises mapping a first equation into a first group of product term elements located between second and third groups of product term elements respectively assigned to second and third equations, and adjusting the product term elements assigned to each of the second and third groups until each product term element of the function block is assigned to only one equation.

15. The method according to claim 14, wherein the step of adjusting the second and third groups comprises pushing one of the second and third groups such that a number of product term elements separating the second and third groups is increased, thereby freeing sufficient product term elements for mapping the non-locked equation.

* * * * *